United States Patent
Nakamura et al.

(10) Patent No.: US 10,031,190 B2
(45) Date of Patent: Jul. 24, 2018

(54) VOLTAGE DETECTION DEVICE

(71) Applicant: DENSO CORPORATION, Kariya, Aichi-pref. (JP)

(72) Inventors: Syota Nakamura, Nomi (JP); Junichi Fukuta, Kuwana (JP)

(73) Assignee: DENSO CORPORATION, Kariya (JP)

( * ) Notice: Subject to any disclaimer, the term of this patent is extended or adjusted under 35 U.S.C. 154(b) by 1122 days.

(21) Appl. No.: 14/264,195

(22) Filed: Apr. 29, 2014

(65) Prior Publication Data

US 2014/0327431 A1    Nov. 6, 2014

(30) Foreign Application Priority Data

May 6, 2013    (JP) ................. 2013-097223

(51) Int. Cl.
*G01D 18/00*    (2006.01)
*G01R 31/42*    (2006.01)
*G01R 19/00*    (2006.01)

(52) U.S. Cl.
CPC ......... *G01R 31/42* (2013.01); *G01R 19/0084* (2013.01)

(58) Field of Classification Search
CPC ....... H01L 2924/00; H01L 2224/45144; H01L 2924/00014; H01L 2224/45015; H01L 2224/48624; H01L 2924/01006; H01L 2924/12032; H01L 2924/12042; H01L 2924/12043; H01L 2924/1306; H01L 45/12; H01L 27/24
See application file for complete search history.

(56) References Cited

U.S. PATENT DOCUMENTS

2011/0156811 A1    6/2011    Shindo et al.
2012/0286717 A1    11/2012    Fukuta et al.

FOREIGN PATENT DOCUMENTS

| JP | S51-842 | 7/1976 |
|---|---|---|
| JP | 2010-246357 | 10/2010 |
| JP | 2011-133345 | 7/2011 |
| JP | 2012-223026 | 11/2012 |
| JP | 2012-239251 | 12/2012 |
| WO | WO 2012/043745 | 4/2012 |

OTHER PUBLICATIONS

Office Action (3 pages) dated May 12, 2015, issued in corresponding Japanese Application No. 2013-097223 and English translation (4 pages).

*Primary Examiner* — Robert Bachner
(74) *Attorney, Agent, or Firm* — Nixon & Vanderhye P.C.

(57) ABSTRACT

A voltage detection device controls operation of system main relays to change an applied voltage supplied to detection circuits. An error of each of the detection circuits is corrected on the basis of a detection value of each of the detection circuits when the applied voltage is changed. In particular, an offset value is corrected on the basis of a detection value of each of the detection circuits when the system main relays and booster switches are controlled so that a voltage of a high voltage battery supplied to each of the detection circuits becomes zero. A gain error is further corrected on the basis of a detection value of each of the detection circuits when the system main relays and the booster switches are controlled so that the applied voltage supplied to each of the detection circuits becomes equal to the voltage of the high voltage battery.

7 Claims, 12 Drawing Sheets

VOLTAGE DETECTION DEVICE

CROSS-REFERENCE TO RELATED APPLICATION

This application is related to and claims priority from Japanese Patent Application No. 2013-97223 filed on May 6, 2013, the contents of which are hereby incorporated by reference.

BACKGROUND OF THE INVENTION

1. Field of the Invention

The present invention relates to voltage detection devices capable of detecting an input voltage of an inverter device.

2. Description of the Related Art

There are known voltage detection devices which detect an input voltage to be supplied to an inverter device. For example, a patent document 1, Japanese patent laid open publication No. JP S51-084279, discloses a voltage detection device which has a voltage detection section and an additional reference voltage generation circuit. The additional reference voltage generation circuit generates a plurality of reference voltages. The conventional voltage detection device corrects a detection error of an offset voltage and a gain error of the voltage detection section by using the generated reference voltages.

Specifically, the conventional voltage detection device disclosed in the patent document 1 (JP S51-084279) corrects a detection error generated in the voltage detection device on the basis of the reference voltage generated by the reference voltage generation circuit and a detection voltage detected when the voltage detection section inputs the reference voltage through input terminals of the voltage detection section.

It is necessary to increase the detection accuracy of the voltage detection device when the voltage detection device is used for an inverter device. The inverter device converts a direct current (DC) power to an alternating current (AC) power. The inverter device detects a voltage necessary for protecting and controlling the inverter device.

The voltage detection device increases its detection accuracy when equipped with the additional reference voltage generation circuit. However, this significantly increases a manufacturing cost of the voltage detection device because of having the additional reference voltage generation circuit and increasing the total number of components thereof.

However, it is possible to increase the detection accuracy of the voltage detection device without using the additional reference voltage generation circuit by adjusting the detection accuracy of the voltage detection device in order to have the optimum detection accuracy in an inspection step during its manufacturing process. However, this method cannot correct any error of the voltage detection section generated by time-dependent change.

SUMMARY

It is therefore desired to provide a voltage detection circuit capable of correcting its detection error caused by time-dependent change without using any additional reference voltage generation circuit.

An exemplary embodiment provides a voltage detection device used for an inverter device capable of converting a direct current power of a direct current power source to an alternating current power. The voltage detection device detects an input voltage to be supplied to the inverter device. The voltage detection device has an input voltage detection circuit, a voltage change section, a voltage control section, and an error correction section. The input voltage detection circuit detects an input voltage. The voltage change section adjusts an applied voltage to be provided to the input voltage detection circuit from the DC power source. The voltage control section controls an operation of the voltage change section. The error correction section corrects an error of the input voltage detection circuit on the basis of a detection value of the input voltage detection circuit when the voltage control section controls the operation of the voltage change section so that the applied voltage becomes equal to a predetermined voltage.

The voltage detection device according to an exemplary embodiment changes the applied voltage to be supplied from the DC power source to the input voltage detection circuit. This structure makes it possible to correct an error of the input voltage detection circuit by using the DC power source as a reference voltage power source. The voltage detection device according to an exemplary embodiment further has an error correction section for correcting the detection error of the input voltage detection section. This structure makes it possible to correct the detection error of the input voltage detection section even after factory shipments.

The voltage detection device according to an exemplary embodiment can correct detection errors of the input voltage detection section caused by elapsed time without using any additional reference voltage generation circuit.

BRIEF DESCRIPTION OF THE DRAWINGS

A preferred, non-limiting embodiment of the present invention will be described by way of example with reference to the accompanying drawings, in which.

DETAILED DESCRIPTION OF THE PREFERRED EMBODIMENTS

Figure 1:
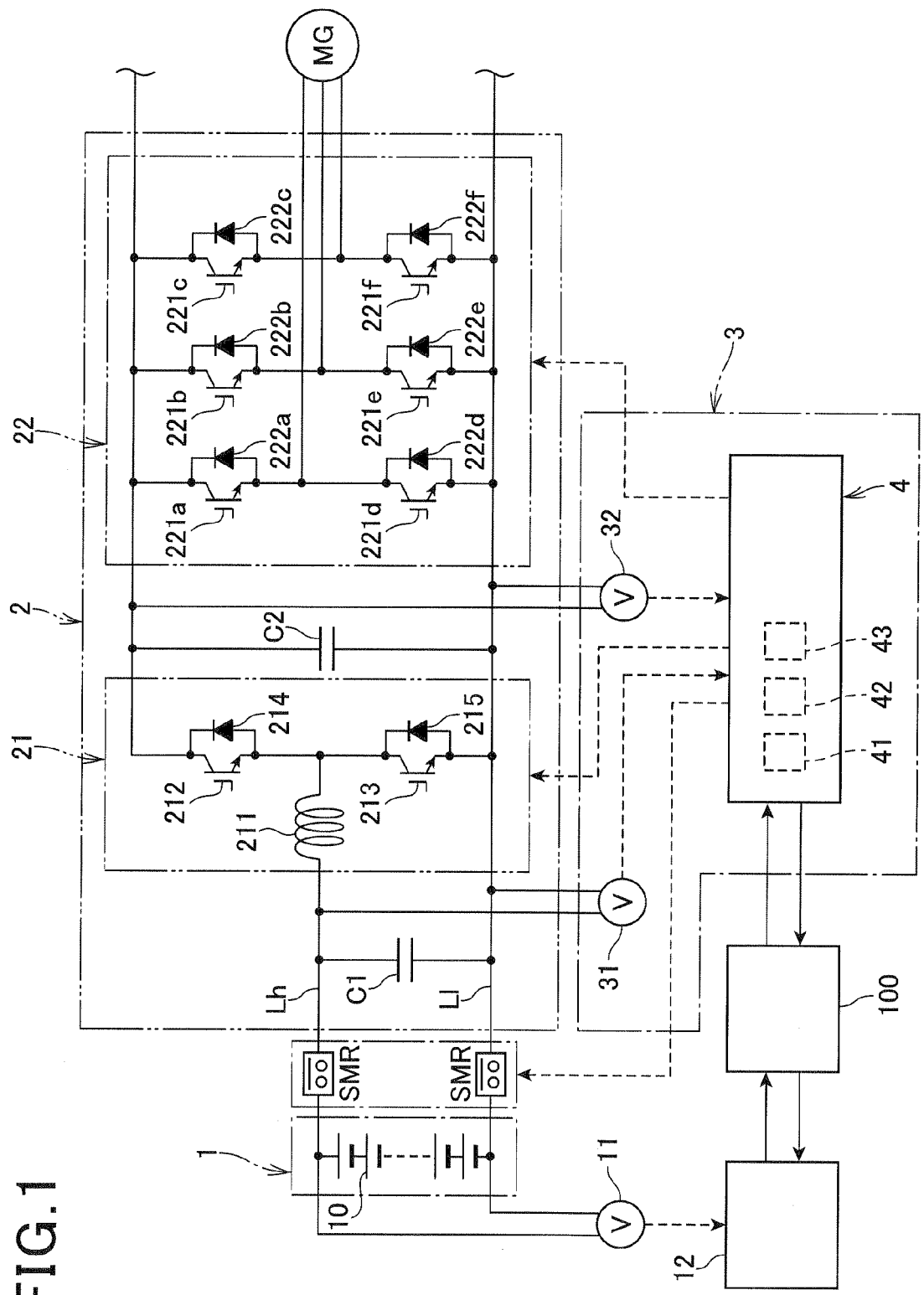
FIG. 1 is a schematic view showing a vehicle drive control system equipped with a voltage detection device according to a first exemplary embodiment of the present invention.

Hereinafter, various embodiments of the present invention will be described with reference to the accompanying drawings. In the following description of the various embodiments, like reference characters or numerals designate like or equivalent component parts throughout the several diagrams.

First Exemplary Embodiment

A description will be given of a voltage detection device according to a first exemplary embodiment which is used for an inverter device in a vehicle drive system mounted to motor vehicles such as electric vehicles and hybrid vehicles.

FIG. 1 is a schematic view showing the vehicle drive control system equipped with a voltage detection device 3 according to the first exemplary embodiment. As shown in FIG. 1, the vehicle drive control system is comprised of a high voltage battery 1, a motor generator MG, an inverter device 2, a voltage detection device 3 and a drive control device (MGECU) 4.

The high voltage battery 1 is an assembled battery composed of cell batteries 10 which are connected in series. Each of the cell batteries 10 is a rechargeable battery such as a lithium ion battery. A voltage between terminals of the high voltage battery 1 is approximately 100 V or more. That is, the high voltage battery 1 outputs a high voltage of not less than 100 V.

A battery voltage detection circuit 11 is connected to both the terminals of the high voltage battery 1. The battery voltage detection circuit 11 detects a battery voltage as a power source voltage of the high voltage battery 1 and outputs a detection signal to a battery ECU 12.

The battery voltage detection circuit 11 is comprised of a voltage detection circuit whose detection accuracy is higher than that of each of a low voltage detection circuit 31 and a high voltage detection circuit 32. The structure and operation of the low voltage detection circuit 31 and the high voltage detection circuit 32 will be explained later.

The battery voltage detection circuit 11 forms a reference voltage detection circuit capable of detecting a voltage potential between a pair of a high voltage side connection line Lh and a low voltage side connection line Ll in the inverter device 2 (which will be explained later).

The battery ECU 12 is a microcomputer comprised of a central processing unit (CPU) and a memory section comprised of memories. The battery ECU 12 serves as a battery control section for performing various processes according to various programs stored in the memory section. The battery ECU 12 monitors an operation state (such as a voltage, a temperature, a current, etc.) of the high voltage battery 1, generated and outputs detection signals to an upper side ECU 100.

The motor generator MG operates as an electric motor when receiving a three phase AC voltage. The motor generator MG also operates as an electric generator for generating a three phase AC voltage when receiving a driving force supplied from an external device.

The inverter device 2 serves as an electric power conversion device capable of converting a DC voltage of the high voltage battery 1 to an AC voltage. The inverter device 2 supplies the converted AC electric power to the motor generator as a main drive power source of the motor vehicle. When receiving the AC electric power, the motor generator drives the motor vehicle.

Figure 2:
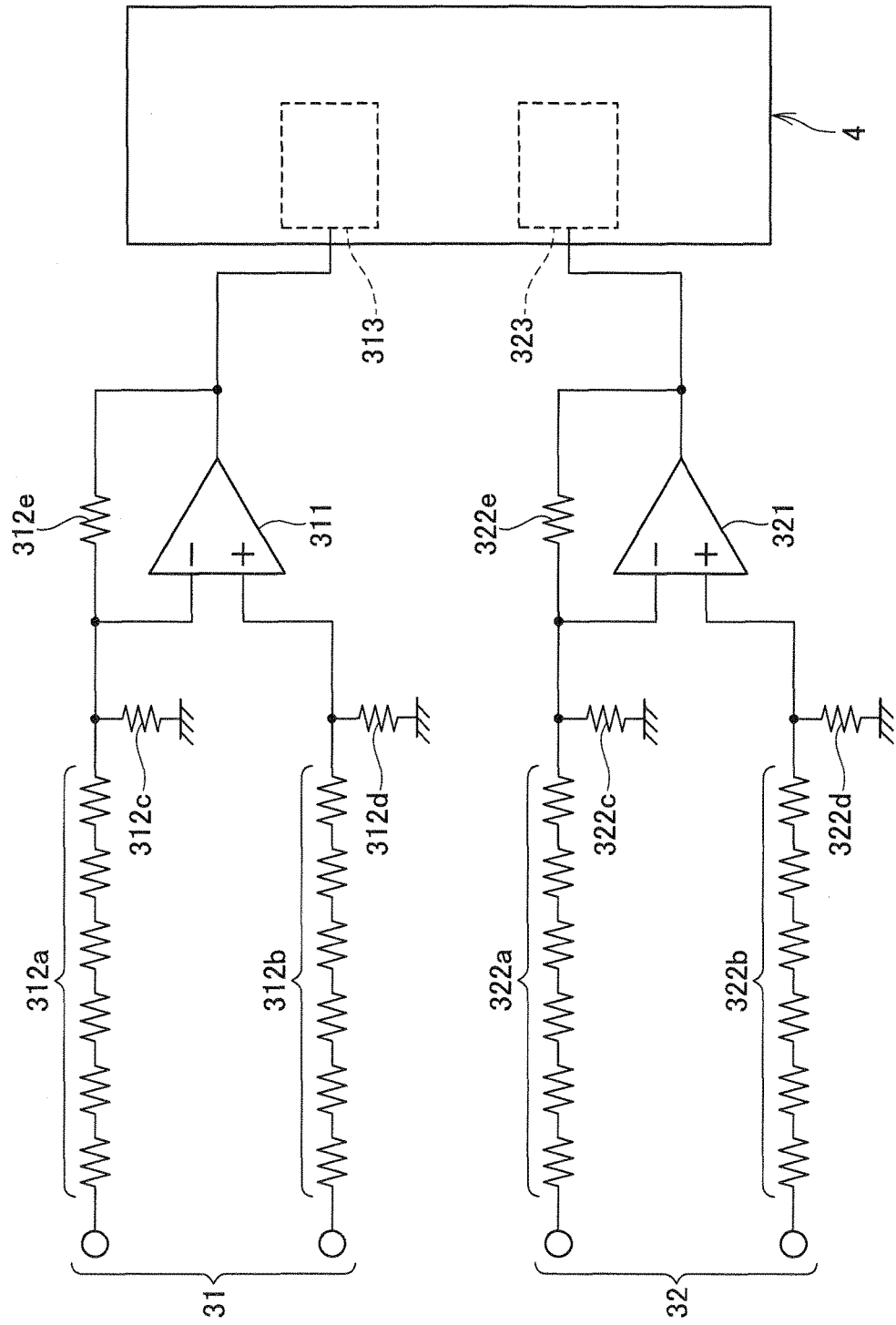
FIG. 2 is a schematic view showing a structure of a low voltage detection circuit and a high voltage detection circuit in the voltage detection device according to the first exemplary embodiment of the present invention.

The inverter device 2 shown in FIG. 2 is equipped with a pair of the connection line Lh (which is also referred to the high voltage side connection line Lh) and the connection line Ll (which is also referred to the low voltage side connection line Ll), a booster circuit 21, an inverter circuit 22, a low voltage side capacitor C1 and a high voltage side capacitor C2.

The connection line Lh is connected to a positive electrode terminal of the high voltage battery 1. The connection line Ll is connected to a negative electrode terminal of the high voltage battery 1.

A system main relay SMR (as a switching section) is arranged on each of the connection lines Lh and Ll. The system main relays SMR electrically connect the high voltage battery 1 to the inverter device 2 and electrically disconnect the inverter device 2 from the high voltage battery 1. The drive control device 4 generates and outputs a control signal to the system main relays SMR in order to control the operation of the system main relays SMR on the basis of the control signal.

The booster circuit 21 is a circuit for boosting a battery voltage (a DC voltage) of the high voltage battery 1 and supplies the boosted DC voltage to the inverter device 2. The booster circuit 21 also decreases the DC voltage supplied from the inverter circuit 22, and charges the high voltage battery 1 with the decreased DC voltage.

The booster circuit 21 is comprised of a coil 211, a pair of a first booster switch 212 and a second booster switch 213 and freewheel diodes 214 and 215. The freewheel diodes 214 and 215 are arranged to the first booster switch 212 and the second booster switch 213, respectively.

The coil 211 is an element for storing and discharging the energy when a current flows in the coil 211. The coil 211 induces a voltage therein. The coil 211 is arranged on the high voltage side connection line Lh. One terminal of the coil 211 is connected to a positive electrode terminal of the low voltage side capacitor C1. The other terminal of the coil 211 is connected to a connection node between the pair of the first booster switch 212 and the second booster switch 213.

The first booster switch 212 and the second booster switch 213 are turned on and off in order to charge the coil 211 with the energy and discharge the energy from the coil 211. The first exemplary embodiment uses insulation gate bipolar transistors (IGBTs) as the first booster switch 212 and the second booster switch 213.

The first booster switch 212 and the second booster switch 213 are connected in series to form a series connection unit. The emitter of the first booster switch 21 arranged at the high voltage side connection line Lh is connected to the collector of the second booster switch 213 arranged between the high voltage side connection line Lh and the low voltage side connection line Ll. A connection node between the first booster switch 212 and the second booster switch 213 is connected to the other terminal of the coil 211. The operation of each of the first booster switch 212 and the second booster switch 213 is controlled on the basis of the control signal transmitted from the drive control device 4. The operation of the drive control device 4 will be explained later.

Each of the freewheel diodes 214 and 215 in the booster circuit 21 is an element capable of supplying a current which is generated during the discharge of the energy stored in the coil 211 when one of the first booster switch 212 and the second booster switch 213 is turned off. The anodes of the freewheel diodes 214 and 215 are connected to the emitters of the first booster switch 212 and the second booster switch 213, respectively. The cathodes of the freewheel diodes 214 and 215 are connected to the collectors of the first booster switch 212 and the second booster switch 213, respectively.

The inverter circuit 22 converts the DC voltage boosted by the booster circuit 21 to a three phase AC voltage and supplies the three phase AC voltage to the motor generator MG. The inverter circuit 22 also converts the three phase AC voltage generated in the motor generator MG to a DC voltage and supplies the DC voltage to the booster circuit 21.

The inverter circuit 22 is comprised of three pairs of series connection units and freewheel diodes 222a to 222f. In the three pairs of the series connection unit, a first conversion switch 221a and a second conversion switch 221d are connected in series, a first conversion switch 221b and a second conversion switch 221e are connected in series and a first conversion switch 221c and a second conversion switch 221f are connected in series. The freewheel diodes 222a to 222f are arranged to the conversion switches 221a to 221f, respectively. Through the description and drawings, reference characters 221a to 221f indicate 221a, 221b, 221c, 221d, 221e and 221f, and reference characters 222a to 222f indicate 222a, 222b, 222c, 222d, 222e and 222f.

Each of the conversion switches 221a to 221f is a switching element to turn on and off in order to convert a DC voltage to a three phase AC voltage. The first exemplary embodiment uses an insulation gate bipolar transistor (IGBT) as each of the conversion switches 221a to 221f.

The emitter of each of the first conversion switches 221a to 221c is connected to the corresponding second conversion switches 221d to 221f. The collector of each of the first conversion switches 221a to 221c is connected to the high voltage side connection line Lh. The emitter of each of the second conversion switches 221d to 221f is connected to the low voltage side connection line Ll. A connection node of the first conversion switch 221a to 221c and the second conversion switch 221d to 221f is connected to the motor generator MG.

Each of the freewheel diodes 222a to 222f in the inverter circuit 22 is an element capable of supplying a current continuously to the motor generator MG when the corresponding conversion switch 221a to 221f is turned off. The anode of each of the freewheel diodes 222a to 222f is connected to the emitter of the corresponding conversion switches 221a to 221f. Further, the cathode of each of the freewheel diodes 222a to 222f is connected to the collector of the corresponding conversion switches 221a to 221f.

The low voltage side capacitor C1 is a smoothing capacitor capable of smoothing a DC voltage before the booster circuit 21 boosts the DC voltage. The low voltage side capacitor C1 smooth the DC voltage supplied from the high voltage battery 1 when the booster circuit 21 performs the booster operation. The low voltage side capacitor C1 smooth the DC voltage supplied to the high voltage battery 1 in order to charge the high voltage battery 1 when the booster circuit 21 performs the voltage step-down operation of the DC voltage. The low voltage side capacitor C1 is connected to both the terminals of the high voltage battery 1 through the high voltage side connection line Lh and the low voltage side connection line Ll.

Similar to the low voltage side capacitor C1, the high voltage side capacitor C2 is a smoothing capacitor capable of smoothing a DC voltage at a high voltage side. The high voltage side capacitor C2 smooth the DC voltage supplied to the inverter circuit 22 when the booster circuit 21 performs the booster operation. The high voltage side capacitor C2 smooth the DC voltage outputted from the inverter circuit 22 when the booster circuit 21 performs the voltage step-down operation of the DC voltage. The high voltage side capacitor C2 is connected to both the terminals of the inverter circuit 22 through the pair of the high voltage side connection line Lh and the low voltage side connection line Ll.

The voltage detection device 3 detects an input voltage supplied to the inverter circuit 2. The voltage detection device 3 according to the first exemplary embodiment is equipped with the low voltage detection circuit 31 and the high voltage detection circuit 32. The low voltage detection circuit 31 and the high voltage detection circuit 32 serve as the input voltage circuit for detecting an input voltage supplied to the inverter circuit 2.

Specifically, the low voltage detection circuit 31 detects a voltage at a low voltage side (at a high voltage 1 side) in the booster circuit 21 as an input voltage supplied to the inverter circuit 2. The low voltage detection circuit 31 outputs an output voltage to the drive control device 4 (which will be explained later in detail). The low voltage detection circuit 31 is connected to nodes whose voltage potential is equal to that of both the terminals of the low voltage side capacitor C1 on the pair of the high voltage side connection line Lh and the low voltage side connection line Ll. That is, the low voltage detection circuit 31 detects a voltage between the terminals of the low voltage side capacitor C1.

The high voltage detection circuit 32 detects a voltage at a high voltage side (at the inverter circuit 22 side) in the booster circuit 21 as an input voltage supplied to the inverter circuit 2. The high voltage detection circuit 32 outputs an output voltage to the drive control device 4 (which will be explained later in detail). The high voltage detection circuit 32 is connected to nodes whose voltage potential is equal to that of both the terminals of the high voltage side capacitor C2 on the pair of the high voltage side connection line Lh and the low voltage side connection line Ll. That is, the high voltage detection circuit 32 detects a voltage between the terminals of the high voltage side capacitor C2.

A description will now be given of a concrete example of the low voltage detection circuit 31 and the high voltage detection circuit 32 in the voltage detection device 3 according to the first exemplary embodiment with reference FIG. 2.

FIG. 2 is a schematic view showing a structure of the low voltage detection circuit 31 and the high voltage detection circuit 32 in the voltage detection device 3 according to the first exemplary embodiment.

As shown in FIG. 2, the low voltage detection circuit 31 is comprised of an operational amplifier 311, voltage dividing resistances 312a to 312d, a feedback resistance 312e and an AD conversion unit 313.

The operational amplifier 311 outputs, to the AD conversion unit 313, a difference in a voltage potential between the pair of the input terminals connected to the booster circuit 21 through the voltage dividing resistances 312a and 312b.

The voltage dividing resistances 312a and 312c divide the voltage at the positive electrode terminal of the low voltage side capacitor C1. The voltage dividing resistances 312a and 312c are connected in series. A connection node between the voltage dividing resistances 312a and 312c is connected to an inverse input terminal of the operational amplifier 21.

The voltage dividing resistances 312b and 312d divide the voltage at the negative electrode terminal of the low voltage side capacitor C1. The voltage dividing resistances 312b and 312d are connected in series. A connection node between the voltage dividing resistances 312b and 312d is connected to an inverse input terminal of the operational amplifier 31.

The feedback resistance 312e is used to determine an amplifying gain of the operational amplifier 311. One terminal of the feedback resistance 312e is connected to an output terminal of the operational amplifier 311, and the other terminal of the feedback resistance 312e is connected to the inverse input terminal of the operational amplifier 31.

The AD conversion unit 313 converts an output voltage (as an analogue signal) outputted from the operational amplifier 311 to digital signals. The AD conversion unit 313 is a built-in device in the drive control device 4 (which will be explained later in detail).

The high voltage detection circuit 32 is comprised of an operational amplifier 321, voltage dividing resistances 322a to 322d, a feedback resistance 322e and an AD conversion unit 323. Because the high voltage detection circuit 32 has approximately the same structure of the low voltage detection circuit 31, the explanation of the high voltage detection circuit 32 is omitted here.

Because FIG. 2 shows a structural example of the low voltage detection circuit 31 and the high voltage detection circuit 32, it is acceptable for the low voltage detection circuit 31 and the high voltage detection circuit 32 to have another structure so long as they have the same function.

A description will now be given of the drive control device 4 as an electric control section in the vehicle drive control system shown in FIG. 1. The drive control device 4 is comprised of a microcomputer. The microcomputer is comprised of a CPU, a memory 41, etc. The memory 41 forms the memory section. The drive control device 4 executes programs stored in the memory 41 in order to perform various processes.

The drive control device 4 has the built-in AD conversion units 313 and 321 in the detection circuits 31 and 32. The drive control device 4 receives detection signals which indicate the voltage at the low voltage side (at the high voltage battery 1 side) in the booster circuit 21 and the voltage at the high voltage side (at the inverter circuit 2 side).

The drive control device 4 is connected to the battery ECU 12 to perform bi-directional communication between the drive control device 4 and the battery ECU 12 through an upper side ECU 100. The drive control device 4 receives a detection result of a battery voltage detection circuit 11 which is transmitted from the battery ECU 12 to the drive control device 4.

The output terminals of the drive control device 4 are connected to the first booster switch 212 and the second booster switch 213 and the conversion switches 221a to 221f. The drive control device 4 instructs each of these switches 212, 213, and 221a to 221f to turn on and off.

The drive control device 4 according to the first exemplary embodiment performs the turning-on and off control of each of the first booster switch 212 and the second booster switch 213 in the booster circuit 21, and each of the conversion switches 221a to 221f in the inverter circuit 22 on the basis of the detection results transmitted from the low voltage detection circuit 31 and the high voltage detection circuit 32.

There is a possibility of the detection accuracy of each of the low voltage detection circuit 31 and the high voltage detection circuit 32 dropping due to an offset error and a gain error generated by characteristic deterioration of components and time-related deterioration of these components which form the low voltage detection circuit 31 and the high voltage detection circuit 32.

Figure 3:
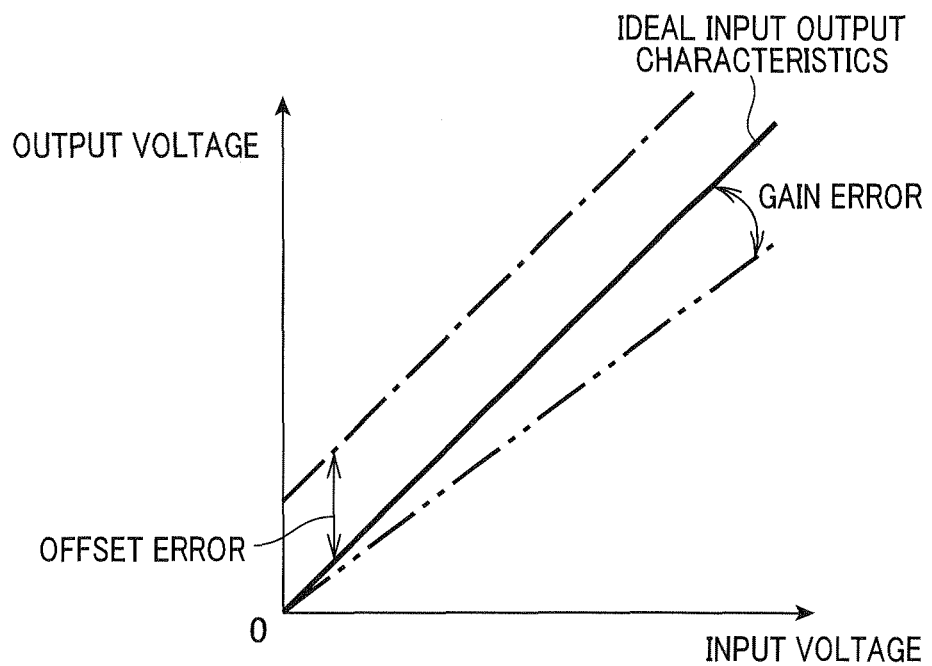
FIG. 3 is a view showing input and output characteristics of the voltage detection device according to the first exemplary embodiment of the present invention in order to explain an offset error and a gain error.

FIG. 3 is a view showing the input and output characteristics of the voltage detection device 3 according to the first exemplary embodiment in order to explain an offset error and a gain error.

As shown with the alternate long and short dash line in FIG. 3, the offset error is generated by shifting an ideal input and output characteristic line of the voltage detection device 3 designated by the solid line shown in FIG. 3 from a reference point (having a value of zero). The gain error is generated by shifting a slope of the ideal input and output characteristic line designated by the solid line shown in FIG. 3.

Figure 4:
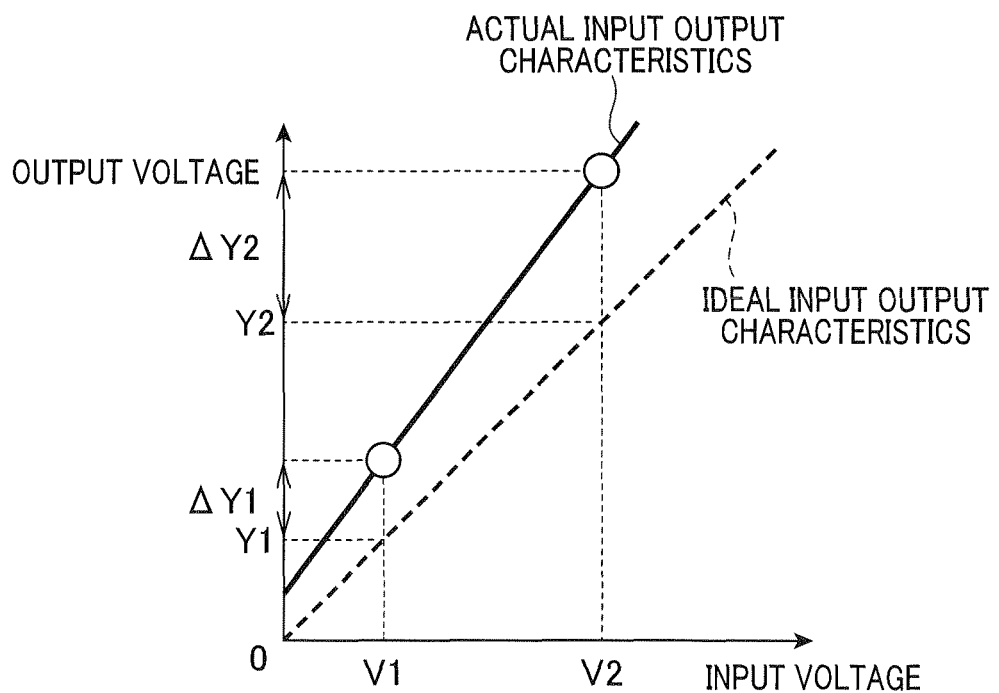
FIG. 4 is a view showing other input and output characteristics of the voltage detection device according to the first exemplary embodiment of the present invention in order to explain an offset error and a gain error.

FIG. 4 is a view showing some input and output characteristics of the voltage detection device 3 according to the first exemplary embodiment in order to explain an offset error and a gain error. When the offset error and the gain error are generated, the actual input and output characteristic line of each of the low voltage detection circuit 31 and the high voltage detection circuit 32 is shifted from the ideal input and output characteristic line of the voltage detection device 3 designated by the solid line shown in FIG. 4. For example, when the input voltage is V1, the actual output line is shifted from the ideal output line Y1 by ΔY1. Still further, when the input voltage is V2 (>V1), the actual output line of each of the low voltage detection circuit 31 and the high voltage detection circuit 32 is shifted from the ideal output line Y2 by ΔY2 (>ΔY1).

In order to avoid the detection error due to such an offset error and a gain error, the drive control device 4 in the voltage detection device 3 according to the first exemplary embodiment performs an error correction process. The error correction process corrects a detection error such as an offset error and a gain error of each of the low voltage detection circuit 31 and the high voltage detection circuit 32 on the basis of the detection value of the battery voltage detection circuit 11.

The error correction process corrects the detection error of each of the low voltage detection circuit 31 and the high voltage detection circuit 32 on the basis of the detection values of each of the low voltage detection circuit 31 and the high voltage detection circuit 32 when a voltage of the high voltage battery 1 supplied to each of the low voltage detection circuit 31 and the high voltage detection circuit 32 is changed by controlling the operation of each of the booster switches 212 and 213.

Specifically, the drive control device 4 controls the operation of each of the system main relay SMR and the booster switches 212 and 213 so that the voltage to be supplied from the high voltage battery 1 to each of the low voltage detection circuit 31 and the high voltage detection circuit 32 becomes zero, and further corrects the offset error on the basis of the detection value of each of the low voltage detection circuit 31 and the high voltage detection circuit 32.

In the voltage detection device 3 according to the first exemplary embodiment, in order to supply the voltage of zero to each of the low voltage detection circuit 31 and the high voltage detection circuit 32, the drive control device 4 turns off each of the booster switches 212 and 213 during the turned-off state of the system main relay SMR so that each of the high voltage side connection line Lh and the low voltage side connection line Ll becomes a short circuit (in a conductive state).

In addition, the drive control device 4 corrects the gain error of each of the low voltage detection circuit 31 and the high voltage detection circuit 32 on the basis of the detection values of each of the low voltage detection circuit 31 and the high voltage detection circuit 32 when the drive control device 4 controls the operation of each of the system main relays SMR and the booster switches 212 and 213 so that the voltage to be supplied to each of the low voltage detection circuit 31 and the high voltage detection circuit 32 becomes the battery voltage of the high voltage battery 1.

In the first exemplary embodiment, the drive control device 4 is controlled in order to adjust the voltage, supplied to each of the low voltage detection circuit 31 and the high voltage detection circuit 32, to become the battery voltage of the high voltage battery 1 only by turning on the first booster switch 212 when the system main relays SMR are turned on.

The system main relays SMR and the first booster switch 212 and the second booster switch 213 form the voltage change section used in the claims. Further, the structure of turning on and off the system main relays SMR and the first booster switch 212 and the second booster switch 213 forms the voltage control section 42 used in the claims. Still further, the structure of performing the error correction process in the drive control device 4 forms the error correction section 43 used in the claims.

Next, a description will now be given of the operation of the vehicle drive control system having the voltage detection device according to the first exemplary embodiment.

The usual control of each of the booster switches 212, 213 and the conversion switches 221a to 221f will be explained. The drive control device 4 performs the usual control.

When the motor generator MG operates as an electric motor, the drive control device 4 turns on the second booster switch 213 on the basis of the detection result transmitted from each of the low voltage detection circuit 31 and the high voltage detection circuit 32. This control accumulates the energy of the high voltage battery 1 to the coil 211. After this, the drive control device 4 turns off the second booster switch 213 in order to discharge the energy stored in the coil 211. At this time, a current generated by the discharging of the energy of the coil 211 flows to the high voltage side capacitor C2 through the freewheel diode 214, and the high voltage side capacitor C2 is thereby charged. The high voltage side capacitor C2 has a predetermined voltage by the repetition of the above operation.

Further, the drive control device 4 turns on and off the conversion switches 221a to 221f on the basis of the detection results of each of the low voltage detection circuit 31 and the high voltage detection circuit 32 in order to convert the DC voltage charged in the high voltage capacitor C2 to a three phase AC voltage and supplies the three phase AC voltage to the motor generator MG. When receiving the three phase AC voltage supplied from the inverter circuit 22, the motor generator MG operates as an electric motor and generates an output torque.

The freewheel diodes 222a, 222b, 222c, 222d, 222e and 222f in the inverter circuit 22 form a rectifying circuit. When the motor generator MG operates as an electric generator, the rectifying circuit composed of the freewheel diodes 222a, 222b, 222c, 222d, 222e and 222f converts the three phase AC voltage to a DC voltage. The high voltage side capacitor C2 is charged by the DC voltage obtained by the inverter circuit 22.

The drive control device 4 turns on the first booster circuit 212 on the basis of the detection result of each of the low voltage detection circuit 31 and the high voltage detection circuit 32 in order to charge the coil 211 with the energy of the high voltage side capacitor C2. After this, the drive control device 4 turns off the first booster circuit 212 in order to discharge the energy accumulated in the coil 211. At this time, a current generated by the discharging of the energy in the coil 211 flows to the high voltage battery 1 through the freewheel diode 215, and the high voltage battery 1 is thereby charged. The high voltage battery 1 has a predetermined voltage by the repetition of the above operation.

A description will now be given of the error correction process performed by the drive control device 4 with reference to the flow chart shown in FIG. 5.

Figure 5:
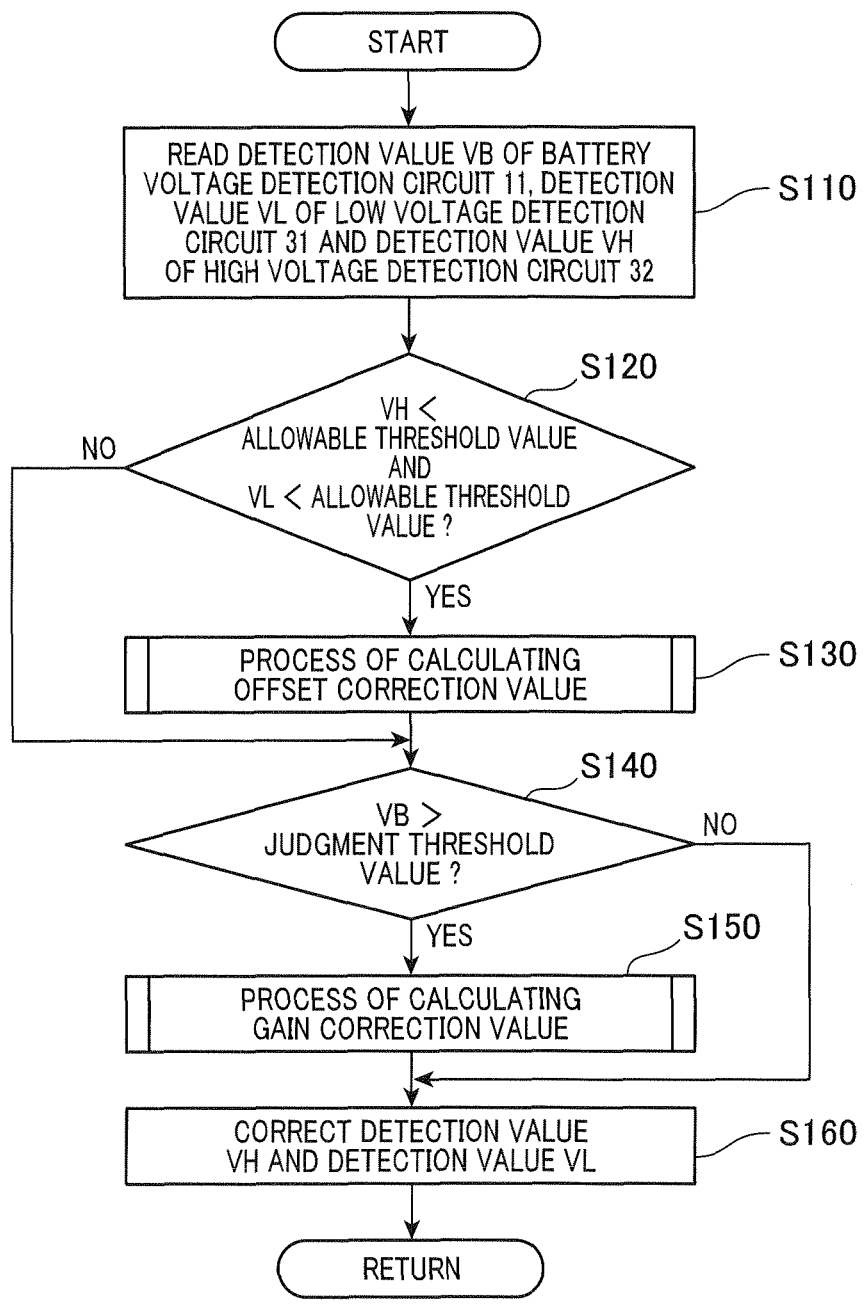
FIG. 5 is a flow chart showing an error correction process performed by a drive control device in the voltage detection device according to the first exemplary embodiment of the present invention.

FIG. 5 is a flow chart showing the error correction process performed by the drive control device 4 in the voltage detection device 3 according to the first exemplary embodiment. The drive control device 4 performs the error correction process of correcting an error contained in a detection value VL of the low voltage detection circuit 31 and an error contained in a detection value of the high voltage detection circuit 32 on the basis of the detection value VB of a battery voltage detection circuit 11.

The drive control device 4 performs the error correction process when the vehicle drive control system starts its operation, that is, when the system main relay SMR and the switches 212, 213 and 221a to 221f are turned off, the DC-DC converter (not shown) and an air conditioning device (not shown) are stopped.

As shown in FIG. 5, the drive control device 4 reads the detection values transmitted from the battery voltage detection circuit 11, the low voltage detection circuit 31 and the high voltage detection circuit 32 in order to obtain the current condition of the vehicle drive control system when the error correction process is executed (step S110).

If electric charge remains in each of the low voltage side capacitor C1 and the high voltage side capacitor C2 which form the smoothing capacitor, the detection values VL and VH of the low voltage detection circuit 31 and the high voltage detection circuit 32a are changed due to the remaining electric charge. This introduces an incorrect operation of the offset error correction process.

The operation flow goes to step S120 from step S110. In step S120, the drive control device 4 detects whether or not each of the detection value VL of the low voltage detection circuit 31 and the detection value VH of the high voltage detection circuit 32 is less than an allowable threshold value. The process in step S120 recognizes whether or not the electric charge in each of the low voltage side capacitor C1 and the high voltage side capacitor C2 is sufficiently charged.

The allowable threshold value used in step S120 is determined on the basis of the detection values VL and VH of the low voltage detection circuit 31 and the high voltage detection circuit 32 when the low voltage side capacitor C1 and the high voltage side capacitor C2 are completely charged.

When the detection result in step S120 indicates affirmation ("YES" in step S120), i.e., indicates that the detection value VL of the low voltage detection circuit 31 is less than the allowable threshold value and the detection value VH of the high voltage detection circuit 32 is less than the allowable threshold value, the operation flow goes to step S130.

In step S130, the drive control device 4 calculates an offset correction value which is used when the offset error is corrected.

On the other hand, when the detection result in step S120 indicates negation ("NO" in step S120), i.e., indicates that the detection value VL of the low voltage detection circuit 31 is not less than the allowable threshold value or the detection value VH of the high voltage detection circuit 32 is not less than the allowable threshold value, the operation flow goes to step S140 without performing step S130.

The process in step S130 calculates the offset correction value of each of the low voltage detection circuit 31 and the high voltage detection circuit 32 on the basis of the fact in which the voltage to be supplied to each of the low voltage detection circuit 31 and the high voltage detection circuit 32 becomes zero when each of the high voltage side connection line Lh and the low voltage side connection line Ll makes a short circuit under the turned-off state of the system main relays SMR.

A description will now be given of the process of calculating the offset correction value with reference to the flow chart shown in FIG. 6.

Figure 6:
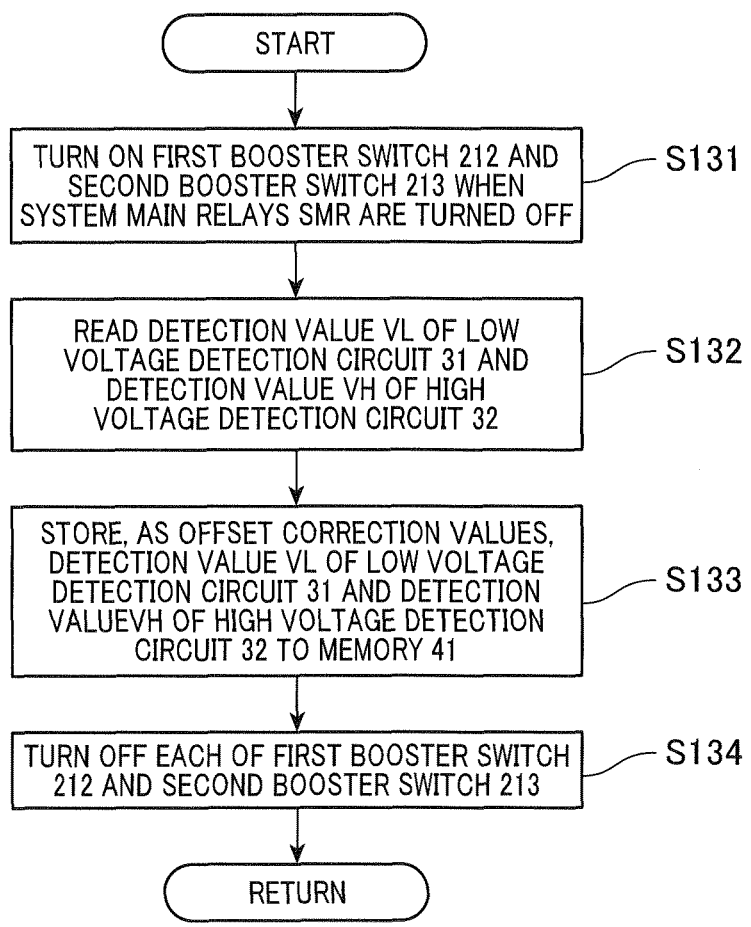
FIG. 6 is a flow chart showing a process of calculating an offset correction value in the error correction process performed by the voltage detection device according to the first exemplary embodiment of the present invention.

FIG. 6 is a flow chart showing the process of calculating the offset correction value in the error correction process performed by the drive control device 4 in the voltage detection device 3 according to the first exemplary embodiment.

As shown in FIG. 6, the drive control device 4 turns on each of the first booster switch 212 and the second booster switch 213 under the turned-off state of the system main relays SMR in order that the voltage to be supplied to each of the low voltage detection circuit 31 and the high voltage detection circuit 32 becomes zero (step S131).

When each of the first booster switch 212 and the second booster switch 213 in the booster circuit 21 is turned on, the high voltage side connection line Lh and the low voltage side connection line Ll are connected together through the first booster switch 212 and the second booster switch 213. As shown in FIG. 1, the high voltage side connection line Lh and the low voltage side connection line Ll are connected to the low voltage side capacitor C1 and the high voltage side capacitor C2. The operation flow goes to step S132.

In step S132, the drive control device 4 obtains the detection value of each of the low voltage detection circuit 31 and the high voltage detection circuit 32. The operation flow goes to step S133.

In step S133, the drive control device 4 stores the detection values obtained from the low voltage detection circuit 31 and the high voltage detection circuit 32 in the memory 41. The operation flow goes to step S134.

In step S134, the drive control device 4 turns off each of the first booster switch 212 and the second booster switch 213 in the booster circuit 21 which have been turned on in step S131. The drive control device 4 completes the routine shown in FIG. 6. The operation flow goes to step S140 in FIG. 5.

The error correction process performed by the drive control device 4 in the voltage detection device 3 according to the first exemplary embodiment uses the detection value VB of the battery voltage detection circuit 11 as a reference value to be used for correcting the detection error of each of the low voltage detection circuit 31 and the high voltage detection circuit 32. Accordingly, there is a possibility of deteriorating the voltage detection accuracy of the voltage detection device 3 due to the corrected gain error if the detection value VB of the battery voltage detection circuit 11 is significantly smaller than a maximum detection value (as a full scale value) of each of the low voltage detection circuit 31 and the high voltage detection circuit 32.

In order to avoid this drawback, the drive control device 4 detects whether or not the detection value VB of the battery voltage detection circuit 11 is greater than a predetermined judgment threshold value (in step S140). When the detection result in step S140 indicates affirmation ("YES" in step S140), i.e. the detection value VB of the battery voltage detection circuit 11 is not more than the predetermined judgment threshold value, the drive control device 4 halts the process of correcting the gain error. The predetermined judgment threshold value is determined on the basis of the maximum detectable value of each of the low voltage detection circuit 31 and the high voltage detection circuit 32. For example, the predetermined judgment threshold value is determined within a normal voltage range during the normal operation state of the high voltage battery 1 (which is out of an over discharge and over charge of the high voltage battery 1).

When the detection result in step S140 indicates affirmation "YES" in step S140), i.e. the detection value VB of the battery voltage detection circuit 11 is greater than the predetermined judgment threshold value, the operation flow goes to step S150.

In step S150, the drive control device 4 performs the process of calculating a gain correction value to be used for correcting the gain error.

The drive control device 4 performs the process in step S150 by using the gain correct value of each of the low voltage detection circuit 31 and the high voltage detection circuit 32 on the basis that the voltage to be supplied to each of the low voltage detection circuit 31 and the high voltage detection circuit 32 becomes equal to the battery voltage of the high voltage battery 1 after the system main relays SMR are turned on.

A description will now be given of the process of calculating the gain correction value with reference to the flow chart shown in FIG. 7.

Figure 7:
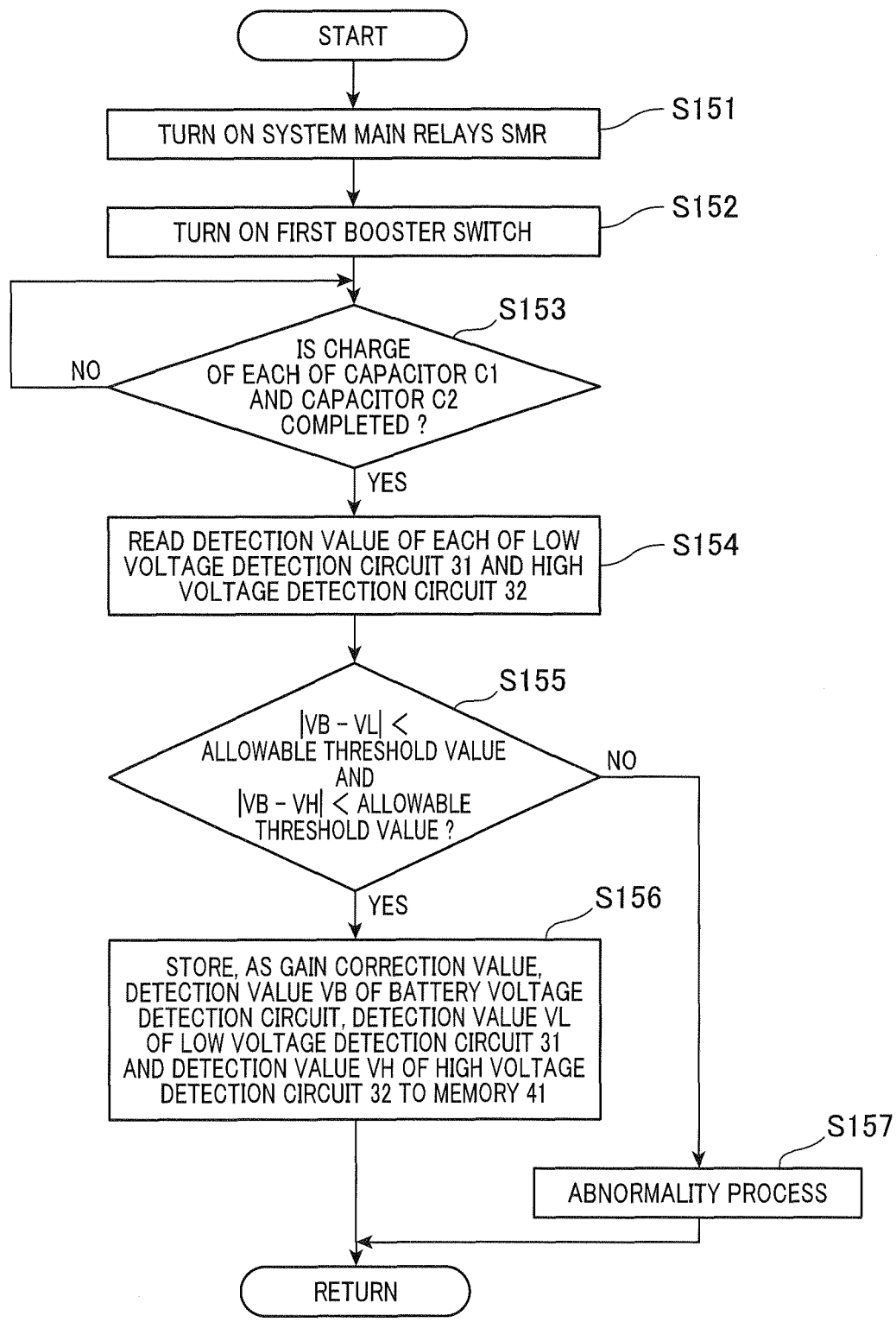
FIG. 7 is a flow chart showing a process of calculating a gain correction value in the error correction process performed by the voltage detection device according to the first exemplary embodiment of the present invention.

FIG. 7 is a flow chart showing the process of calculating the gain correction value in the error correction process performed by the drive control device 4 in the voltage detection device 3 according to the first exemplary embodiment.

As shown in FIG. 7, the drive control device 4 turns on the system main relays SMR in order to connect the high voltage battery 1 to the inverter device 2 (in step S151). The operation flow goes to step S152.

In step S152, the drive control device 4 turns on the first booster switch 212 in the booster circuit 21.

When the first booster switch 212 in the booster circuit 21 is turned on during the turned-on state of the system main relays SMR, the battery voltage of the high voltage battery 1 is supplied to each of the low voltage side capacitor C1 and the high voltage side capacitor C2. After the charging of the low voltage side capacitor C1 and the high voltage side capacitor C2 by the battery voltage of the high voltage battery 1, the battery voltage is supplied to each of the low voltage detection circuit 31 and the high voltage detection circuit 32.

The operation flow goes to step S153. In step S153, the drive control device 4 detects whether or not the low voltage side capacitor C1 and the high voltage side capacitor C2 are completely charged with the battery voltage.

When the detection result in step S153 indicates affirmation ("YES" in step S153), i.e. the low voltage side capacitor C1 and the high voltage side capacitor C2 are completely charged with the battery voltage, the operation flow goes to step S154.

In step S154, the drive control device 4 receives the detection value of each of the low voltage detection circuit 31 and the high voltage detection circuit 32. The operation flow goes to step S155.

When the battery voltage detection circuit 11 falls in an abnormality state in which it is difficult to correctly detect the battery voltage of the high voltage battery 1, a difference in detection value between the battery voltage detection circuit 11 and the low voltage detection circuit 31 becomes a large value, and a difference in detection value between the battery voltage detection circuit 11 and the high voltage detection circuit 32 becomes a large value. In the abnormality state, when the drive control device 4 performs the process of correcting the gain error, the voltage detection accuracy of the voltage detection device 3 is decreased.

In order to avoid this drawback, the drive control device 4 detects whether or not the absolute value of the difference in detection value between the battery voltage detection circuit 11 and the low voltage detection circuit 31 is within a predetermined allowable range, and whether or not the absolute value of the difference in detection value between the battery voltage detection circuit 11 and the high voltage detection circuit 32 is within the predetermined allowable range. The drive control device 4 determines the predetermined allowable range in advance so that the difference (as the absolute value) in detection value between the battery voltage detection circuit 11 and the low voltage detection circuit 31 becomes within a difference range caused by an usual operation.

When the detection result in step S155 indicates affirmation ("YES" in step S155), i.e. the absolute value of the difference in detection value between the battery voltage detection circuit 11 and the low voltage detection circuit 31 is within the predetermined allowable range, and the absolute value of the difference in detection value between the battery voltage detection circuit 11 and the high voltage detection circuit 32 is within the predetermined allowable range, the operation flow goes to step S156.

In step S156, the drive control device 4 stores, as gain correction values, the detection value VB of the battery voltage detection circuit 11, the detected value VL of the low voltage detection circuit 31 and the detection value VH of the high voltage detection circuit 32 into the memory 41.

On the other hand, when the detection result in step S155 indicates negation ("NO" in step S155), i.e. the absolute value of the difference in detection value between the battery voltage detection circuit 11 and the low voltage detection circuit 31 is out from the predetermined allowable range, and the absolute value of the difference in detection value between the battery voltage detection circuit 11 and the high voltage detection circuit 32 is out from the predetermined allowable range, the operation flow goes to step S157.

In step S157, the drive control device 4 halts the process of correcting the gain error and performs an abnormality process of informing occurrence of the abnormality state.

In the abnormality process, it is acceptable of the drive control device 4 to perform one of halting correction of the gain error and informing of the occurrence of the abnormality state. There are various methods to inform the occurrence of the abnormality state to an operator, for example, by turning on a LED lamp and warning the occurrence of the abnormality state to the upper side ECU 100.

After the processes in step S156 and S157, the drive control device 4 completes the routine shown in FIG. 7. The operation flow goes to step S160 shown in FIG. 5.

In step S160, the drive control device 4 corrects the detection value VL of the low voltage detection circuit 31 and the detection value VH of the high voltage detection circuit 32 on the basis of the offset correction value of each of the low voltage detection circuit 31 and the high voltage detection circuit 32 obtained in step S130 and the gain correction value of each of the low voltage detection circuit 31 and the high voltage detection circuit 32 obtained in step S150.

Specifically, the drive control device 4 determines the function of specifying the input and output characteristics of each of the low voltage detection circuit 31 and the high voltage detection circuit 32 on the basis of the offset correction values obtained in step S130 and the gain correction value obtained in step S150. The drive control device 4 corrects each of the detection value VL of the low voltage detection circuit 31 and the detection value VH of the high voltage detection circuit 32 while referring the function.

When not performing the process in step S130 of calculating the offset correction value, the drive control device 4 does not calculate the offset correction value. In this case, it is sufficient for the drive control device 4 to correct each of the detection value VL of the low voltage detection circuit 31 and the detection value VH of the high voltage detection circuit 32 on the basis of the gain correction value only, or to halt the process of correcting such errors.

Furthermore, when the drive control device 4 does not perform the process in step S150 of calculating the gain correction value or perform the abnormality process in step S157, the drive control device 4 does not calculate the gain correction value. In this case, in the process in step S160, it is sufficient for the drive control device 4 to correct each of the detection value VL of the low voltage detection circuit 31 and the detection value VH of the high voltage detection circuit 32 on the basis of the offset correction value only, or to halt the correction of the errors.

As previously described in detail, the drive control device 4 in the voltage detection device 3 according to the first exemplary embodiment corrects the detection error of each of the low voltage detection circuit 31 and the high voltage detection circuit 32 on the basis of the detection value of each of the low voltage detection circuit 31 and the high voltage detection circuit 32 when the voltage supplied from the high voltage battery 1 to each of the low voltage detection circuit 31 and the high voltage detection circuit 32 is changed by controlling the operation of each of the system main relays SMR, the booster switch 212 and the booster switch 213.

While changing the voltage of the high voltage battery 1 supplied to the low voltage detection circuit 31 and the high voltage detection circuit 32, the drive control device 4 corrects the detection error of each of the low voltage detection circuit 31 and the high voltage detection circuit 32 by using the high voltage battery 1 as the reference voltage source. Furthermore, because the voltage detection device 3 according to the first exemplary embodiment corrects the detection error of each of the low voltage detection circuit 31 and the high voltage detection circuit 32, it is possible to correct the detection error of each of the low voltage detection circuit 31 and the high voltage detection circuit 32 even after factory shipments.

The voltage detection device 3 according to the first exemplary embodiment can correct the detection error of each of the low voltage detection circuit 31 and the high voltage detection circuit 32 caused by time-dependent change without using any reference voltage generation circuit.

Still further, according to the first exemplary embodiment, because it is not necessary to use any device or facility capable of supplying a high voltage, which corresponds to the high voltage battery 1 during an inspection process before factory shipments, this makes it possible to decrease the manufacturing cost of the voltage detection device 3.

Still further, the first exemplary embodiment uses the system main relays SMR and the booster switches 212 and 213 as the voltage change section for changing the voltage to be supplied to each of the low voltage detection circuit 31 and the high voltage detection circuit 32.

Because the inverter device 2 having the structure previously described is used as the voltage change section for changing the voltage to be supplied to each of the low voltage detection circuit 31 and the high voltage detection circuit 32, it is possible to correctly perform the error correction process without increasing the number of the components in the voltage detection device 3. This makes it possible to provide the voltage detection device 3 having a superior function with a simple structure.

The drive control device 4 in the voltage detection device 3 according to the first exemplary embodiment halts the process of calculating the gain correction value when the battery voltage VB detected by the battery voltage detection circuit 11 becomes not more than the predetermined judgment threshold value. This structure makes it possible to avoid deterioration of the detection accuracy of the voltage detection device 3 by using too small voltage of the high voltage battery 1 in the error correction process.

Still further, the drive control device 4 in the voltage detection device 3 according to the first exemplary embodiment halts the process of calculating the offset correction value when the detection value of each of the low voltage detection circuit 31 and the high voltage detection circuit 32, before each of the low voltage detection circuit 31 and the high voltage detection circuit 32 calculates the offset correction value, is more than the predetermined allowable threshold value. This makes it possible to avoid deterioration of the detection accuracy of the voltage detection device 3 generated by performing the error correction process when the electrical charge remains in each of the low voltage side capacitor C1 and the high voltage side capacitor C2 which form the smoothing capacitor.

Furthermore, the drive control device 4 in the voltage detection device 3 according to the first exemplary embodiment performs the abnormality process if a difference in detection value between the battery voltage detection circuit 11 and each of the low voltage detection circuit 31 and the high voltage detection circuit 32 becomes out of the allowable range when the voltage to be supplied to each of the low voltage detection circuit 31 and the high voltage detection circuit 32 becomes equal to the battery voltage of the high voltage battery 1.

Second Exemplary Embodiment

A description will now be given of the voltage detection device 3 according to the second exemplary embodiment with reference to FIG. 8 to FIG. 10.

The explanation of the same components and processes between the first exemplary embodiment and the second exemplary embodiment is omitted here for brevity.

In the structure of the voltage detection device according to the second exemplary embodiment, the high voltage detection circuit 32 has its detection accuracy which is higher than that of the low voltage detection circuit 31. The drive control device 4 in the voltage detection device 3 performs the error correction process of correcting the detection error of the low voltage detection circuit 31 on the basis of the detection value VH of the high voltage detection circuit 32 having the high detection accuracy. In the second exemplary embodiment, the high voltage detection circuit 32 forms the reference voltage detection circuit used in the claims.

A description will now be given of the error correction process performed by the drive control device 4 with reference to FIG. 8.

Figure 8:
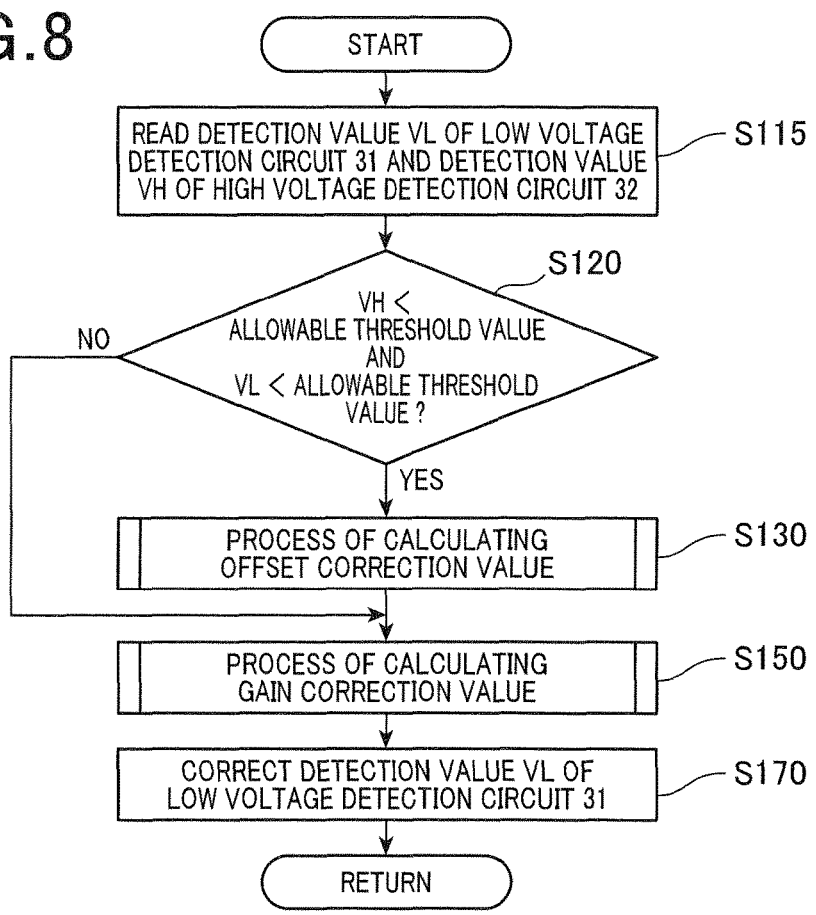
FIG. 8 is a flow chart showing the error correction process performed by the drive control device in the voltage detection device according to a second exemplary embodiment of the present invention.

FIG. 8 is a flow chart showing the error correction process performed by the drive control device 4 in the voltage detection device 3 according to the second exemplary embodiment.

The flow chart shown in FIG. 8 corresponds to the flow chart shown in FIG. 1 used in the first exemplary embodiment. The drive control device 4 performs the error correction process when the system main relays SMR are turned off and the DC-DC converter (not shown) and the air conditioning device (not shown) are stopped.

As shown in FIG. 8, the drive control device 4 reads the detection value VL of the low voltage detection circuit 31 and the detection value VH of the high voltage detection circuit 32 (in step S115). The operation flow goes to step S120.

In step S120, the drive control device 4 detects whether or not each of the detection value VL of the low voltage detection circuit 31 and the detection value VH of the high voltage detection circuit 32 is less than the allowable threshold value.

When the detection result in step S120 indicates affirmation ("YES" in step S120), i.e. each of the detection value VL of the low voltage detection circuit 31 and the detection value VH of the high voltage detection circuit 32 is less than the allowable threshold value, the operation flow goes to step S130. In step S130, the drive control device 4 performs the process of calculating the offset correction value.

On the other hand, when the detection result in step S120 indicates negation ("NO" in step S120), i.e. each of the detection value VL of the low voltage detection circuit 31 and the detection value VH of the high voltage detection circuit 32 is not less than the allowable threshold value, the drive control device 4 does not perform the process of calculating the offset correction value, and the operation flow goes to step S150.

A description will now be given of the process in step S130 with reference to the flow chart shown in FIG. 9.

Figure 9:
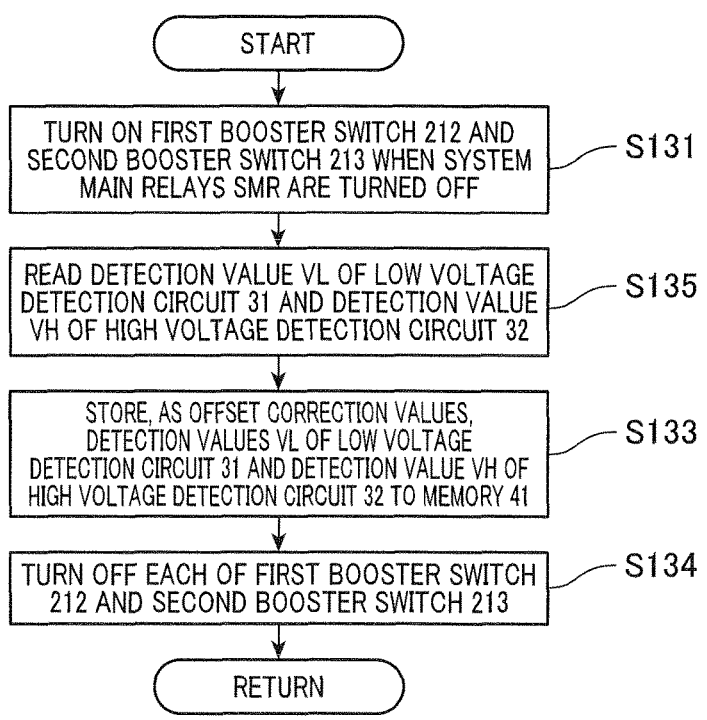
FIG. 9 is a flow chart showing the process of calculating the offset correction value in the error correction process performed by the voltage detection device according to the second exemplary embodiment of the present invention.

FIG. 9 is the flow chart showing the process of calculating the offset correction value in the error correction process performed by the drive control device 4 in the voltage detection device 3 according to the second exemplary embodiment. The flow chart shown in FIG. 9 corresponds to the flow chart shown in FIG. 6.

As shown in FIG. 9, the drive control device 4 turns on each of the first booster switch 212 and the second booster switch 213 under the turned-off state of the system main relays SMR in order that the voltage to be supplied to each of the low voltage detection circuit 31 and the high voltage detection circuit 32 becomes zero (step S131). The operation flow goes to step S135.

In step S135, the drive control device 4 reads the detection value of each of the low voltage detection circuit 31 and the high voltage detection circuit 32. The operation flow goes to step S133.

In step S133, the drive control device 4 stores, as offset correction values to the memory 41, the detection values obtained from the low voltage detection circuit 31 and the high voltage detection circuit 32.152 The operation flow goes to step S134.

In step S134, the drive control device 4 turns off each of the first booster switch 212 and the second booster switch 213 in the booster circuit 21 which have been turned on in step S141. The drive control device 4 completes the routine shown in FIG. 9. The operation flow goes to step S140 (which performs the process of calculating the gain correction value) in FIG. 8.

In the second exemplary embodiment, the drive control device 4 calculates the gain correction value on the basis of the condition in which the voltage of the booster circuit 21 (as the voltage supplied to the low voltage detection circuit 31) becomes equal to the voltage of the booster circuit 21 (as the voltage supplied to the high voltage detection circuit 32) before the voltage boosting process of the booster circuit 21 when the system main relays SMR are turned on.

A description will now be given of the process of calculating the gain correction value with reference to the flow chart shown in FIG. 10. The flow chart shown in FIG. 10 corresponds to the flow chart shown in FIG. 7.

Figure 10:
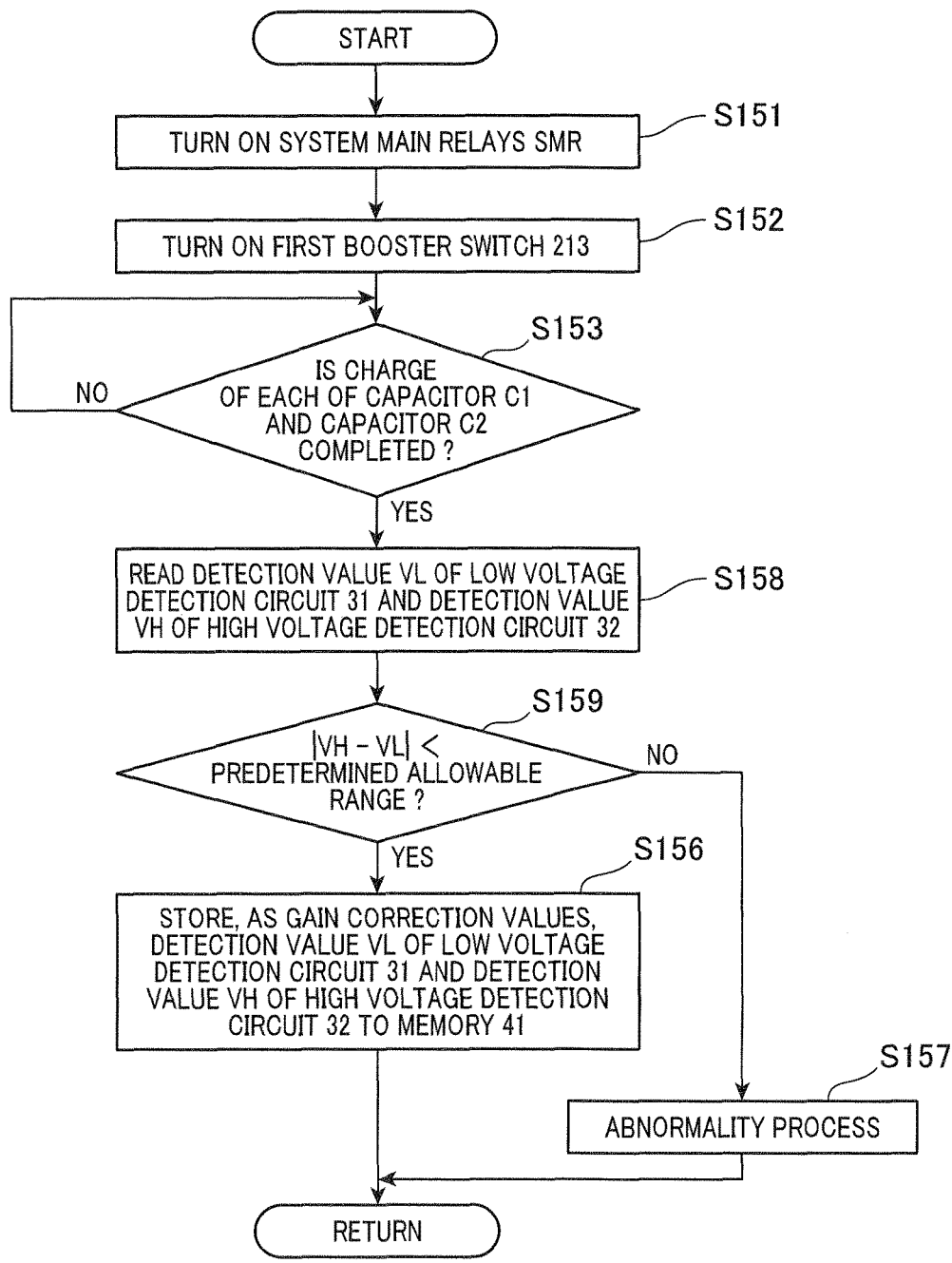
FIG. 10 is a flow chart showing the process of calculating the gain correction value in the error correction process performed by the voltage detection device according to the second exemplary embodiment of the present invention.

FIG. 10 is a flow chart showing the process of calculating the gain correction value in the error correction process performed by the voltage detection device according to the second exemplary embodiment of the present invention;

As shown in FIG. 10, after turning off the system main relays SMR (step S151), the drive control device 4 turns on the first booster switch 212 in the booster circuit 21 (in step S152). This makes it possible to supply the battery voltage of the high voltage battery 1 to both the terminals of each of the low voltage side capacitor C1 and the high voltage side capacitor C2. When the charging of the low voltage side capacitor C1 and the high voltage side capacitor C2 is completed, the voltage at the low voltage side of the booster circuit 21 (as the voltage to be supplied to the low voltage detection circuit 31 becomes equal to the voltage to be supplied to the high voltage detection circuit 32.

The drive control device 4 waits for each of the low voltage side capacitor C1 and the high voltage side capacitor C2 is completely charged. After this, the drive control device 4 reads the detection value VL of the low voltage detection circuit 31 and the detection value VH of the high voltage detection circuit 32 (step in S158).

When the high voltage detection circuit 32 fails to function normally, i.e. causes a malfunction and enters an abnormality state, a difference in detection value between the low voltage detection circuit 31 and the high voltage detection circuit 32 is increased. In this case, the detection accuracy of each of the low voltage detection circuit 31 and the high voltage detection circuit 32 is decreased when the drive control device 4 performs the process of correcting the gain error.

In order to avoid this drawback, the drive control device 4 detects whether or not the absolute value of a difference in detection value between the low voltage detection circuit 31 and the high voltage detection circuit 32 is within the predetermined allowable range (step S159).

The drive control device 4 determines the predetermined allowable range in advance so that the difference (as its absolute value) in detection value between the low voltage detection circuit 31 and the high voltage detection circuit 32 becomes within a difference range caused by an usual operation.

When the detection result in step S159 indicates affirmation ("YES" in step S159), i.e. the difference in the absolute value of the difference in detection value between the battery voltage detection circuit 11 and each of the low voltage detection circuit 31 and the high voltage detection circuit 32 is within the predetermined allowable range, the drive control device 4 stores as the gain correction values the detection value VL of the low voltage detection circuit 31 and the detection value VH of the high voltage detection circuit 32 (step S156).

On the other hand, when the detection result in step S159 indicates negation ("NO" in step S159), i.e. the difference in the absolute value of the difference in detection value between the battery voltage detection circuit 11 and each of the low voltage detection circuit 31 and the high voltage detection circuit 32 is out of the predetermined allowable range, the operation flow goes to step S157.

In step S157, the drive control device 4 performs the abnormality process without performing the process of calculating the gain correction value.

After the process in step S156 or the process in step S157, the drive control device 4 completes the routine shown in FIG. 10. The operation flow goes to step S170 shown in FIG. 8.

In step S170, the drive control device 4 corrects the detection value VL of the low voltage detection circuit 31. In the process of step S170, the drive control device 4 corrects the detection value VL of the low voltage detection circuit 31 on the basis of the offset correction value and the gain correction value of the low voltage detection circuit 31 calculated by the process in step S130 and the process in step S150.

Other processes in the second exemplary embodiment are the same of those in the first exemplary embodiment. The drive control device 4 in the voltage detection device 3 according to the second exemplary embodiment having the structure previously described has the following effect in addition to the effects described in the description of the first exemplary embodiment. That is, the structure of the voltage detection device 3 according to the second exemplary embodiment is incorporated with the high voltage detection circuit 32 has a high detection accuracy when compared with the detection accuracy of the low voltage detection circuit 31, and uses the high voltage detection circuit 32 as the reference voltage detection circuit.

Because the high voltage detection circuit 32, its detection accuracy is higher than that of the low voltage detection circuit 31, is used as the reference voltage detection circuit, it is possible to detect the voltage boosted by the booster circuit 21 with high accuracy without any error correction. Still further, this makes it possible to suppress the increasing of the manufacturing cost of the voltage detection circuit 3 increasing the detection accuracy of the voltage of each of the low voltage detection circuit 31 and the high voltage detection circuit 32.

Third Exemplary Embodiment

A description will be given of the voltage detection device according to the third exemplary embodiment with reference to FIG. 11 to FIG. 14.

Figure 11:
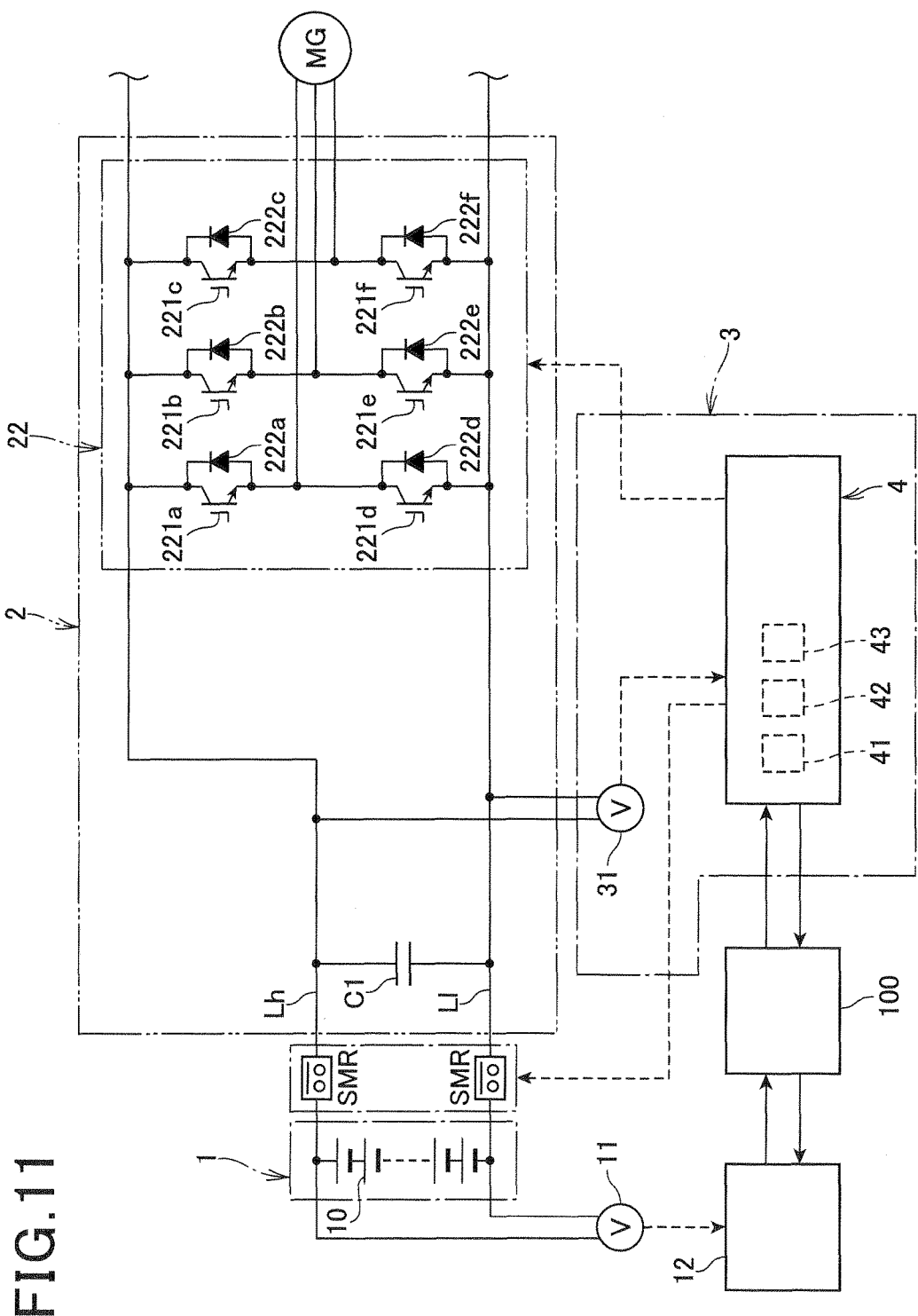
FIG. 11 is a schematic view showing the vehicle drive system equipped with the voltage detection device according to a third exemplary embodiment of the present invention.

FIG. 11 is a schematic view showing the vehicle drive system equipped with the voltage detection device 3 according to the third exemplary embodiment.

As shown in FIG. 11, the voltage detection device 3 according to the third exemplary embodiment is used for the inverter circuit 2 without the booster circuit 21. The explanation of the same components and processes between the third exemplary embodiment and the first and second exemplary embodiments is omitted here for brevity.

As shown in FIG. 11, the inverter device 2 is equipped with a pair of the high voltage side connection line Lh and the low voltage side connection line Ll, the inverter circuit 22 and the low voltage side capacitor C1. Further, the voltage detection device 3 according to the third exemplary embodiment has the low voltage detection circuit 31. The low voltage detection circuit 31 detects the battery voltage of the high voltage battery 1 as the input voltage to be supplied to the inverter circuit 21.

When the motor generator MG operates as an electric motor, the drive control device 4 turns on and off each of the conversion switches 221a to 221f on the basis of the detection result transmitted from each of the low voltage detection circuit 31. Further, the drive control device 4 converts the DC voltage supplied from the high voltage battery 1 to a three phase AC voltage, and the inverter circuit 22 supplies the three phase AC voltage to the motor generator MG. When receiving the three phase AC voltage supplied from the inverter circuit 22, the motor generator MG operates as an electric motor and generates and outputs a torque. By the way, when the motor generator MG operates as a motor generator, the inverter circuit 22 converts the three phase AC voltage generated by the motor generator MG to a DC voltage. The high voltage battery 1 is charged with the DC voltage converted from the three phase AC voltage by the inverter circuit 2.

In the third example embodiment, the battery voltage detection circuit 11 has a detection accuracy which is higher than that of the low voltage detection circuit 31. The drive control device 4 performs the error correction process of correcting the detection error of the low voltage detection circuit 31 on the basis of the detection value VB of the battery voltage detection circuit 11. The battery voltage detection circuit 11 corresponds to the reference voltage detection circuit used in the claims.

A description will now be given of the error correction process performed by the drive control device 4 with reference to the flow chart shown in FIG. 12.

Figure 12:
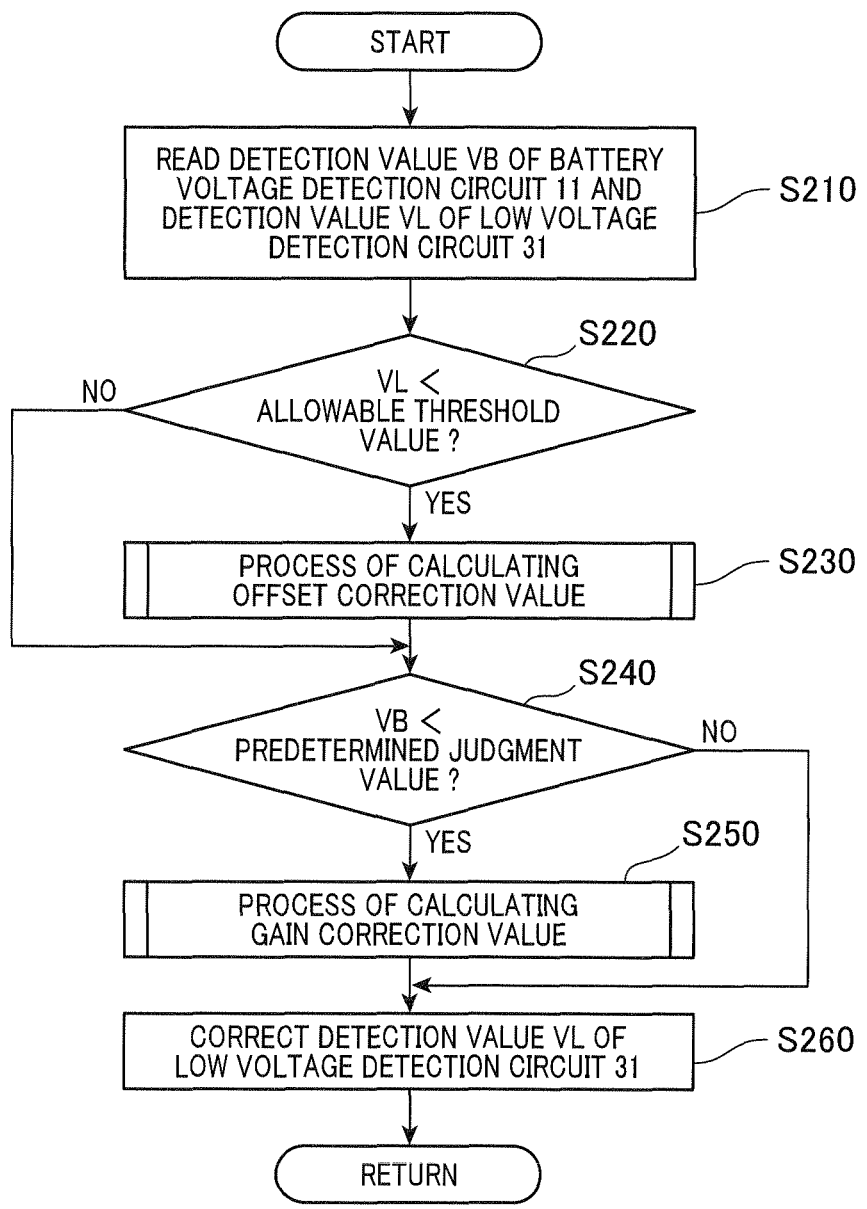
FIG. 12 is a flow chart showing the error correction process performed by the drive control device in the voltage detection device according to the third exemplary embodiment of the present invention.

FIG. 12 is a flow chart showing the error correction process performed by the drive control device in the voltage detection device according to the third exemplary embodiment.

Similar to the second exemplary embodiment, the drive control device 4 performs the error correction process when the system main relays SMR are turned off and the operation of each of the DC-DC converter (not shown) and the air conditioning device (not shown) is stopped.

As shown in FIG. 12, the drive control device 4 reads the detection value of each of the detection value VB of the battery voltage detection circuit 11 and the detection value VL of the low voltage detection circuit 31 (in step S210). The operation flow goes to step S220.

In step S220, the drive control device 4 detects whether or not each of the detection value VB of the battery voltage detection circuit 11 and the detection value VL of the low voltage detection circuit 31 is less than the allowable threshold value.

As a result, when the detection result in step S220 indicates affirmation ("YES" in step S220), i.e. the detection value VL of the low voltage detection circuit 31 is less than the allowable threshold value, the operation flow goes to step S230. In step S230, the drive control device 4 performs the process of calculating the offset correction value.

On the other hand, when the detection result in step S220 indicates negation ("NO" in step S220), i.e. the detection value VL of the low voltage detection circuit 31 is not less than the allowable threshold value, the operation flow goes to step S240 without performing the process of calculating the offset value correction value.

A description will now be given of the process in step S230 with reference to the flow chart shown in FIG. 13.

Figure 13:
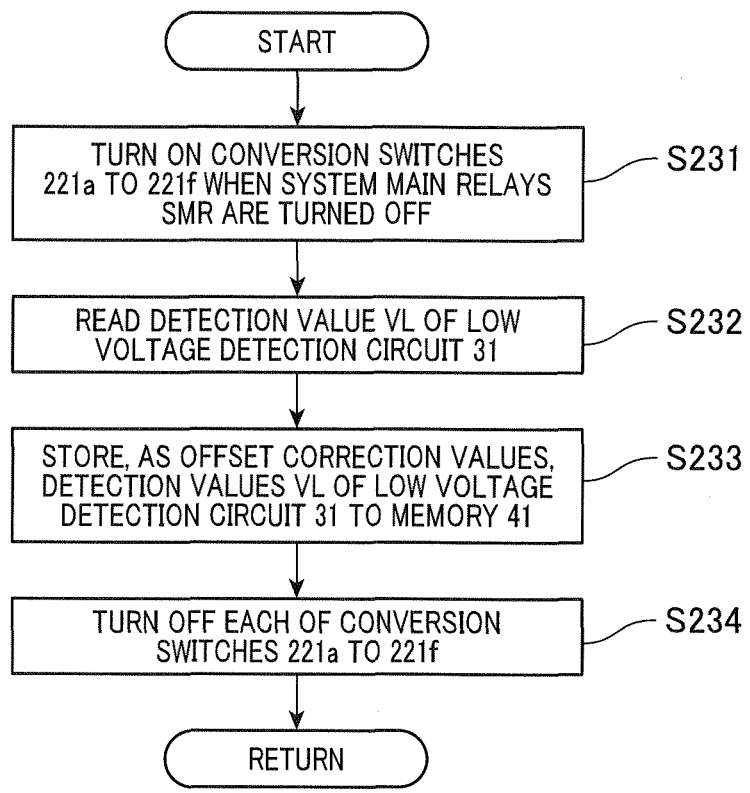
FIG. 13 is a flow chart showing the process of calculating the offset correction value in the error correction process performed by the voltage detection device according to the third exemplary embodiment of the present invention.

FIG. 13 is a flow chart showing the process of calculating the offset correction value in the error correction process performed by the drive control device 4 in the voltage detection device 3 according to the third exemplary embodiment.

As shown in FIG. 13, the drive control device 4 turns on the first and second conversion switches 221a to 221f in the inverter circuit 22 under the turned-off state of the system main relays SMR in order that the voltage to be supplied to the low voltage detection circuit 31 becomes zero (step S231).

It is thereby possible for the high voltage side connection line Lh and the low voltage side connection line Ll connected to the low voltage side capacitor C1 to have the same voltage potential. This makes it possible to supply the voltage of zero to the low voltage detection circuit 31. In the process in step S231, it is not necessary to turn on all of the conversion switches 221a to 221f. It is sufficient for the drive control device 4 to turn on one selected from all of the series connection units composed of the first and second conversion switches 221a to 221f.

The operation flow goes to step S232. In step S232, the drive control device 4 reads the detection value VL of the low voltage detection circuit 31. The operation flow goes to step S233.

In step S233, the drive control device 4 stores the detection value VL of the low voltage detection circuit 31 as the offset correction value to the memory 41. The operation flow goes to step S234.

In step S234, the drive control device 4 turns off the conversion switches 221a to 221f which have been turned on in step S231.

The drive control device 4 completes the routine shown in FIG. 13. The operation flow goes to step S240 from step S230 shown in FIG. 12. The operation flow goes to step S240 from step S230.

In step S240 shown in FIG. 12, the drive control device 4 detects whether or not the detection value VB of the battery voltage detection circuit 11 is more than the predetermined judgment threshold value.

When the detection result in step S240 indicates affirmation ("YES" in step S240), i.e. detection value VB of the battery voltage detection circuit 11 is more than the predetermined judgment threshold value, the operation flow goes to step S250. In step S250, the drive control device 4 performs the process of calculating the gain correction value.

On the other hand, when the detection result in step S240 indicates negation ("NO" in step S240), i.e. detection value VB of the battery voltage detection circuit 11 is not more than the predetermined judgment threshold value, the operation flow goes to step S260 without performing the process of calculating the gain correction value.

The predetermined judgment threshold value is determined on the basis of the maximum detectable value of the low voltage detection circuit 31. For example, the predetermined judgment threshold value is determined within a normal voltage range during the normal operation state of the high voltage battery 1 (which is out of an over discharge and over charge of the high voltage battery 1).

A description will now be given of the process of calculating the gain correction value with reference to the flow chart shown in FIG. 14.

Figure 14:
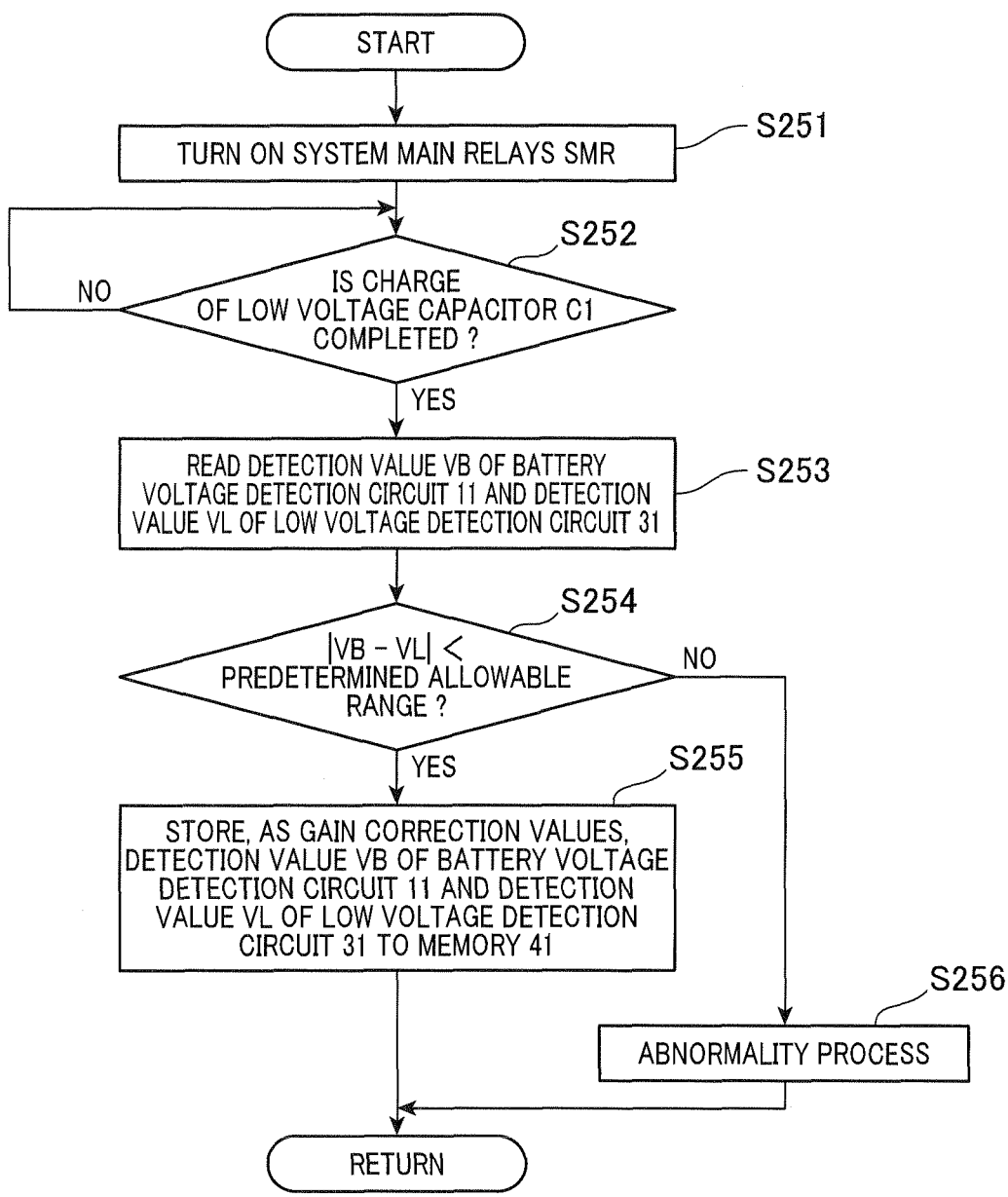
FIG. 14 is a flow chart showing the process of calculating the gain correction value in the error correction process performed by the voltage detection device according to the third exemplary embodiment of the present invention.

FIG. 14 is a flow chart showing the process of calculating the gain correction value in the error correction process performed by the drive control device 4 in the voltage detection device 3 according to the third exemplary embodiment.

In step S251 shown in FIG. 14, the drive control device 4 turns on the system main relays SMR (step S251). This makes it possible to supply the battery voltage of the high voltage battery 1 to both the terminals of the low voltage side capacitor C1. The operation flow goes to step S252.

In step S252, the drive control device 4 waits for the low voltage side capacitor C1 to be completely charged. After the completion of the charging of the low voltage side capacitor C1, the operation flow goes to step S253.

In step S253, the drive control device 4 reads the detection value VB of the battery voltage detection circuit 11 and the detection value VL of the low voltage detection circuit 31. The operation flow goes to step S254.

In step S254, the drive control device 4 detects whether or not the absolute value of a difference between the detection value VB of the battery voltage detection circuit 11 and the detection value VL of the low voltage detection circuit 31 is within the predetermined allowable range (step S254). The drive control device 4 determines the predetermined allowable range in advance so that the difference (as the absolute value) in detection value between the battery voltage detection circuit 11 and the low voltage detection circuit 31 becomes being within a difference range caused by an usual operation.

When the detection result in step S254 indicates affirmation ("YES" in step S254), i.e. the absolute value of the difference between the detection value VB of the battery voltage detection circuit 11 and the detection value VL of the low voltage detection circuit 31 is within the predetermined allowable range, the operation flow goes to step S255.

In step S255, the drive control device 4 stores the detection value VB of the battery voltage detection circuit 11 and the detection value VL of the low voltage detection circuit 31 as the gain correction values to the memory 41.

On the other hand, when the detection result in step S254 indicates negation ("NO" in step S254), i.e. the absolute value of the difference between the detection value VB of the battery voltage detection circuit 11 and the detection value VL of the low voltage detection circuit 31 is out from the predetermined allowable range, the operation flow goes to step S256.

In step S256, the drive control device 4 performs the abnormality process without performing the process of calculating the gain correction value. The abnormality process provides a warning to the operator. In the abnormality process, it is acceptable of the drive control device 4 to perform one of the halt of correcting the gain error and the informing of the occurrence of the abnormality state.

After the completion of the process in step S255 or the process in step S256, the drive control device 4 completes the routine shown in FIG. 14. The operation flow goes to step S260 from step S250 shown in FIG. 12.

In step S260, the drive control device 4 corrects the detection value VL of the low voltage detection circuit 31 on the basis of the offset correction value obtained in step S230 and the gain correction value obtained in step S250.

Specifically, the drive control device 4 determines the function of specifying the input and output characteristics of each of the low voltage detection circuit 31 and the high voltage detection circuit 32 on the basis of the offset correction values obtained in step S230 and the gain correction value obtained in step S250. The drive control device 4 corrects the detection value VL of the low voltage detection circuit 31 while performing the function.

If the drive control device 4 does not calculate the gain correction value and/or the offset correction value, it is sufficient for the drive control device 4 to correct the detection value VL of the low voltage detection circuit 31 on the basis of the calculated correction value only or halt the correction of the errors in the process in step S160.

Other processes in the third exemplary embodiment are the same of those in the first exemplary embodiment and the second exemplary embodiment. The drive control device 4 in the voltage detection device 3 according to the third exemplary embodiment having the structure previously described has the same effects of the first exemplary embodiment and the second exemplary embodiment.

The system main relays SMR and each of the conversion switches 221a to 221f form the voltage change section used in the claims. The function of turning on and off the system main relays SMR and the conversion switches 221a to 221f form the voltage control section used in the claims.

Other Modifications

The concept of the present invention is not limited by the first, second and third exemplary embodiments previously described. It is possible for the voltage detection device according to the present invention to have the various modifications such as the following structures and operations, for example.

(1) It is preferable to perform the countermeasure processes (such as the processes in step S120, S140 and S150) in the error correction process in order to prevent deterioration of the detection accuracy of the voltage detection device 3. However, the concept of the present invention is not limited by the first, second and third exemplary embodiments previously described. It is possible for the voltage detection device according to the present invention to omit one or more the processes in step S120 and S140.

(2) Each of the first, second and third exemplary embodiments performs the process of correcting the offset error and the gain error. However, the concept of the present invention is not limited by the first, second and third exemplary embodiments previously described. It is possible for the voltage detection device according to the present invention to correct one of the offset error and the gain error.

(3) The first, second and third exemplary embodiments explain the examples in which the drive control device 4 in the voltage detection device 3 directly controls the operation of the system main relays SMR, etc. in order to adjust the voltage to be supplied to the detection circuits forming the input voltage detection circuit. However, the concept of the present invention is not limited by the first, second and third exemplary embodiments previously described. It is possible for the voltage detection device according to the present invention to indirectly control the operation of the system main relays MSR etc. through the upper side ECU 100. Further, it is possible to add a device for controlling the operation of the system main relays SMR, etc.

(4) The first to third exemplary embodiments explain the examples in which the various types of switches 212, 213 and 212a to 212f which form the inverter device 2 adjust the voltage to be supplied to each of the low voltage detection circuit 31 and the high voltage detection circuit 32. However, the concept of the present invention is not limited by the first, second and third exemplary embodiments previously described. It is possible for the voltage detection device according to the present invention to add a relay which makes a short circuit of the high voltage side connection line Lh and the low voltage side connection line Ll. In this case, the voltage of zero is supplied to each of the low voltage detection circuit 31 and the high voltage detection circuit 32 by making a short circuit between the high voltage side connection line Lh and the low voltage side connection line Ll when the drive control device 4 calculates the offset correction value. In this structure, the system main relays SMR and the additional relay form the voltage change section used in the claims.

(5) The first, second and third exemplary embodiments explain the examples in which the voltage of zero is supplied to each of the low voltage detection circuit 31 and the high voltage detection circuit 32 by turning on each of the first booster switch 212 and the second booster switch 213 during the turned-off state of the system main relays SMR. However, the concept of the present invention is not limited by the first, second and third exemplary embodiments previously described.

For example, it is possible for the voltage detection device according to the present invention to supply the voltage of zero to each of the low voltage detection circuit 31 and the high voltage detection circuit 32 by turning on the second booster switch 213 and each of the conversion switches 221a to 221f during the turned-off state of the system main relays SMR.

(6) As previously described, the drive control device 4 in the voltage detection device 3 according to the first exemplary embodiment performs the error correction process of correcting the detection error of both the low voltage detection circuit 31 and the high voltage detection circuit 32. However, the concept of the present invention is not limited by the first, second and third exemplary embodiments. It is possible for the voltage detection device according to the present invention to correct the detection error of one of the low voltage detection circuit 31 and the high voltage detection circuit 32.

(7) As previously described, the drive control device 4 in the voltage detection device 3 according to the second exemplary embodiment uses the high voltage detection circuit 32 whose detection accuracy is higher than the detection accuracy of the low voltage detection circuit 31, and uses the high voltage detection circuit 32 as the reference voltage detection circuit. However, the concept of the present invention is not limited by the first, second and third exemplary embodiments previously described. It is possible for the voltage detection device according to the present invention to use the low voltage detection circuit 31 whose detection accuracy is higher than the detection accuracy of the high voltage detection circuit 32, and uses the low voltage detection circuit 31 as the reference voltage detection circuit.

(8) Each of the first to third exemplary embodiments previously described applies the voltage detection device to the inverter device 2 of a vehicle drive control system. However, the concept of the present invention is not limited by the first, second and third exemplary embodiments. It is possible to apply the concept of the voltage detection device according to the present invention to an inverter device used for various drive systems other than a motor vehicle.

(9) It is possible to combine the subject matter of each of the first to third exemplary embodiment so long as the combination of the first, second and third exemplary embodiments is effective.

While specific embodiments of the present invention have been described in detail, it will be appreciated by those skilled in the art that various modifications and alternatives to those details could be developed in light of the overall teachings of the disclosure. Accordingly, the particular arrangements disclosed are meant to be illustrative only and not limited to the scope of the present invention which is to be given the full breadth of the following claims and all equivalents thereof.

What is claimed is:

1. A voltage detection device to be applied to an inverter device capable of converting a direct current power of a direct current power source to an alternating current power, the voltage detection device comprising:
    a pair of a first connection line and a second connection line connected to both end terminals of the direct current power source;
    an input voltage detection circuit connected between the first connection line and the second connection line, configured to detect a supplied direct current voltage which is supplied from the direct current power source to the inverter device;
    a reference voltage detection circuit connected between the first connection line and the second connection line to detect, as a reference voltage, a voltage potential between the first connection line and the second connection line, the reference voltage detection circuit having a detection accuracy higher than a detection accuracy of the input voltage detection circuit;
    a voltage change circuit comprising a booster circuit and an inverter circuit configured to adjust the supplied direct current voltage detected by the input voltage detection circuit, the booster circuit comprising a first booster switch and a second booster switch connected in series, the first booster switch being connected to the first connection line, the second booster switch being connected to the second connection line, and the booster circuit boosting the supplied direct current voltage supplied from the direct current power source, the inverter circuit converting the voltage boosted by the booster circuit to an alternating current voltage;
    a computer system, comprising a central processing unit and memory for storing instructions which upon execution by the central processing unit enable the computer system to at least provide:
    a voltage control section configured to generate a voltage control signal to control a voltage value changing operation of the voltage change circuit, and to transmit the voltage control signal to the voltage change circuit; and
    an error correction section configured to calculate a voltage difference between the supplied direct current voltage detected by the input voltage detection circuit and a predetermined voltage, to generate a correction signal on the basis of the voltage difference calculated by the error correction section, and to transmit the correction signal to the voltage control section so that the supplied direct current voltage becomes equal to the predetermined voltage, wherein the input voltage detection circuit comprises a low voltage detection circuit configured to detect a voltage at a low voltage side of the booster circuit, the reference voltage detection circuit comprises a high voltage detection circuit configured to detect a voltage boosted by the booster circuit at a high voltage side of the booster circuit, and the error correction section corrects the gain error of the input voltage detection circuit on the basis of the supplied direct current voltage detected by the input voltage detection circuit and the reference voltage detected by the reference voltage detection circuit when the voltage control section controls the operation of the voltage change circuit so that a voltage at the high voltage side of the booster circuit and a voltage at the low voltage side of the booster circuit become equal to the supplied direct current voltage supplied from the direct current power source at a timing when the first booster switch in the booster circuit is turned on and the second booster switch is turned off.

2. The voltage detection device according to claim 1, wherein the inverter device comprises the booster circuit configured to boost the supplied direct current voltage supplied from the direct current power source and the inverter circuit configured to convert the voltage boosted by the booster circuit to an alternating current voltage, the reference voltage detection circuit comprises a power source voltage detection circuit configured to detect the power source voltage of the direct current power source, and the error correction section corrects the gain error of the input voltage detection circuit on the basis of the supplied direct current voltage detected by the input voltage detection circuit and the reference voltage detected by the reference voltage detection circuit when the voltage control section controls the operation of the voltage change circuit so that the supplied direct current voltage becomes equal to the power source voltage of the direct current power source to be supplied to the reference voltage detection circuit.

3. The voltage detection device according to claim 2, wherein the error correction section prohibits the correction of the gain error when the reference voltage detected by the reference voltage detection circuit is not more than a predetermined judgment threshold value.

4. The voltage detection device according to claim 1, wherein the first connection line is connected to a high voltage side of the direct current power source and the second connection line is connected to a low voltage side of the direct current power source, the first booster switch and the second booster switch form a series connection unit connected in series in the booster circuit, the first booster switch is connected to the first connection line and the second booster switch is connected to the second connection line, the inverter circuit comprises series connection units, each of the series connection units in the inverter circuit comprises a first conversion switch and a second conversion switch connected in series, the first conversion switch is connected to the first connection line, and the second conversion switch is connected to the second connection line, and the voltage change circuit comprises at least one of the series connection unit comprised of the first booster switch and the second booster switch and the series connection units comprised of the first conversion switch and the second conversion switch.

5. The voltage detection device according to claim 1, wherein the error correction section performs, as an abnormality process, one of prohibition from correcting the gain error and a warning of an abnormality state supplied to an operator when the supplied direct current voltage detected by the input voltage detection circuit and the reference voltage detected by the reference voltage detection circuit become out from a predetermined allowable range at a timing when the voltage control section performs a control of the voltage change circuit so that the supplied direct current voltage and the voltage supplied to the reference voltage detection circuit become equal to the power source voltage of the direct current power source.

6. The voltage detection device according to claim 1, wherein the voltage change circuit comprises a switching section capable of electrically connecting and disconnecting an electrical connection between the direct current power source and the inverter device, and the error correction section corrects an offset error of the input voltage detection circuit on the basis of the supplied direct current voltage detected by the input voltage detection circuit when the voltage control section turns off at least the switching section so that the supplied direct current voltage becomes zero.

7. The voltage detection device according to claim 6, wherein the error correction section prohibits the correction of the offset error when the supplied direct current voltage detected by the input voltage detection section is more than a predetermined threshold value when the voltage control section turns off the switching section.

* * * * *